(12) United States Patent
Surla et al.

(10) Patent No.: US 10,607,850 B2
(45) Date of Patent: Mar. 31, 2020

(54) IODINE-CONTAINING COMPOUNDS FOR ETCHING SEMICONDUCTOR STRUCTURES

(71) Applicants: American Air Liquide, Inc., Fremont, CA (US); L'Air Liquide, Société Anonyme pour l'Etude et l'Exploitation des Procédés Georges Claude, Paris (FR); Air Liquide Electronics U.S. LP, Dallas, TX (US)

(72) Inventors: Vijay Surla, Newark, DE (US); Rahul Gupta, Newark, DE (US); Hui Sun, Hockessin, DE (US); Venkateswara R. Pallem, Hockessin, DE (US); Nathan Stafford, Damascas, OR (US); Fabrizio Marchegiani, Newark, DE (US); Vincent M. Omarjee, Grenoble (FR); James Royer, Bear, DE (US)

(73) Assignees: American Air Liquide, Inc., Fremont, CA (US); Air Liquide Electronics U.S. LP, Dallas, TX (US); L'Air Liquide, SociétéAnonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 15/396,220

(22) Filed: Dec. 30, 2016

(65) Prior Publication Data
US 2017/0178923 A1   Jun. 22, 2017

(51) Int. Cl.
*H01L 21/311* (2006.01)
*H01L 21/308* (2006.01)
(Continued)

(52) U.S. Cl.
CPC .. *H01L 21/31116* (2013.01); *H01L 21/31144* (2013.01); *H01L 21/32137* (2013.01); *H01L 27/11582* (2013.01); *H01L 28/00* (2013.01)

(58) Field of Classification Search
CPC ......... H01L 21/31116; H01L 27/11582; H01L 21/32137; H01L 21/31144; H01L 27/115
See application file for complete search history.

(56) References Cited

U.S. PATENT DOCUMENTS 6,387,287 B1   5/2002   Hung et al.
9,460,935 B2   10/2016  Chung
(Continued)

FOREIGN PATENT DOCUMENTS

JP   H10 223614   8/1998
JP   2000 100792  4/2000
(Continued)

OTHER PUBLICATIONS

Karecki, S.M. et al., Plasma etching of silicon dioxide and silicon nitride with non-perfluorocompounds chemistries: trifluoroacetic anhydride and iodofluorocoarbons, MRS Online Proceedings Library, Cambridge University Press, Std. Num. 19464274, Feb. 10, 2011, 67-74.

(Continued)

*Primary Examiner* — Nadine G Norton
*Assistant Examiner* — Mahmoud Dahimene
(74) *Attorney, Agent, or Firm* — Yan Jiang; Patricia E. McQueeney

(57) ABSTRACT

A method for etching silicon-containing films is disclosed. The method includes the steps of introducing a vapor of an iodine-containing etching compound into a reaction chamber containing a silicon-containing film on a substrate, wherein the iodine-containing etching compound has the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3; introducing an inert gas into the reaction chamber; and activating a plasma to produce an activated (Continued)

iodine-containing etching compound capable of etching the silicon-containing film from the substrate.

19 Claims, 23 Drawing Sheets

(51) Int. Cl.
  *H01L 21/3065* (2006.01)
  *H01L 21/3213* (2006.01)
  *H01L 27/11582* (2017.01)
  *H01L 49/02* (2006.01)

(56) References Cited

U.S. PATENT DOCUMENTS

| | | |
|---|---|---|
| 2004/0035825 A1 | 2/2004 | Nakamura et al. |
| 2006/0140836 A1* | 6/2006 | Oka ............... B01D 53/685 423/240 S |
| 2009/0176375 A1* | 7/2009 | Benson ............ H01L 21/31116 438/719 |
| 2011/0059617 A1* | 3/2011 | Mitchell ............ C23C 16/4405 438/723 |
| 2011/0180941 A1 | 7/2011 | Hwang et al. |
| 2013/0029484 A1* | 1/2013 | Shimizu ............ H01L 21/31116 438/636 |
| 2014/0073139 A1 | 3/2014 | Suzuki |
| 2015/0270135 A1* | 9/2015 | Tabat ............... H01L 21/02046 438/712 |
| 2015/0294880 A1* | 10/2015 | Anderson ......... H01L 21/31116 438/719 |

FOREIGN PATENT DOCUMENTS

| | | |
|---|---|---|
| JP | 2006 108484 | 4/2006 |
| TW | I343601 | 6/2011 |
| WO | WO 2008 097638 | 8/2008 |
| WO | WO 2015 035381 | 3/2015 |

OTHER PUBLICATIONS

Sumakawa, S. et al., New radical-control method for SiO 2 etching with non-perfluorocompound gas chemistries, Jpn. J. Appl. Phys. vol. 37 (1998), L1095-L1097.

International Search Report and Written Opinion for corresponding PCT/US2017/069085, Apr. 27, 2018.

Karecki, S.M. et al., Plasma etching of dielectric films with novel iodofluorocarbon chemistries: iodotrifluoroethylene and 1-iodoheptafluoropropane, J. Vac. Sci, Technol. A 16 (1998), 755-758.

* cited by examiner

IODINE-CONTAINING COMPOUNDS FOR ETCHING SEMICONDUCTOR STRUCTURES

TECHNICAL FIELD

Methods for etching silicon-containing films are disclosed. The method includes the steps of introducing the vapor of an iodine-containing etching compound into a reaction chamber containing the silicon-containing film on a substrate. The iodine-containing etching compound have the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3; introducing an inert gas into the reaction chamber; and activating a plasma to produce an activated iodine-containing etching compound capable of etching the silicon-containing film from the substrate.

BACKGROUND

In memory applications in the semiconductor industries, such as DRAM and 2D NAND, plasma etching removes silicon-containing films, such as silicon oxide or silicon nitride layers, from semiconductor substrates. For 3D NAND, etching of stacks of multiple SiO/SiN or SiO/poly-Silicon (p-Si) layers is critical. See, e.g., US 2011/0180941 to Samsung Electronics Co., Ltd. An etchant having high selectivity between the mask and layers being etched is essential. Furthermore, the etched structure should have a straight vertical profile without bowing and low line edge roughness (LER).

Traditional etch gases include octafluorocyclobutane ($cC_4F_8$), hexafluoro-1,3-butadiene ($C_4F_6$), $CF_4$, $CH_2F_2$, $CH_3F$, and/or $CHF_3$. It is well known that selectivity and polymer deposition rate increase as the ratio of C:F increases (i.e., $C_4F_6$>$C_4F_8$>$CF_4$). See, e.g., U.S. Pat. No. 6,387,287 to Hung et al. In addition, other gases, such as inert gases like Ar, Kr, or Xe, are added to the plasma where they are ionized and accelerated to the wafer surface bombarding the surface and supporting the etching process. Because they are inert gases, they do not directly participate in the chemical reactions of the etching process.

However, traditional etch chemistries may not be able to provide a feature, such as a hole or trench, having an aspect ratio higher than 20:1, which is necessary in the newer applications (e.g., 3D NAND), at least due to insufficient etch resistant polymer deposition on sidewalls during the plasma etching processes. The sidewall —$C_xF_y$— polymers, wherein x ranges from 0.01 to 1 and y ranges from 0.01 to 4, may be susceptible to etching. As a result, the etched patterns may not be vertical and the etch structures may show bowing, change in dimensions, pattern collapse and/or increased roughness.

Bowing may result from sidewall etching of the mask layer, which may often be an amorphous carbon (a-C) material. The a-C materials may be etched by oxygen radicals in the plasma which may cause increased opening of the mask and result in bow-like, or angled/curved, etch structures.

Iodine-containing compounds have been used as etching gases. For example, Chung (U.S. Pat. No. 9,460,935) discloses etching first and second etching layers under plasma generated using, among others, 1,1,2,2-tetrafluoro-1-iodo-ethane. See also Karecki et al., Plasma etching of dielectric films with novel iodofluorocarbon chemistries: iodotrifluoroethylene and 1-iodoheptafluoropropane, J. Vac. Sci. Technol. A 16, 755 (1998); JP2006/108484 to Ulvac; TWI343601 to Ulvac.

It is important to minimize bowing and to achieve high aspect ratio (i.e., up to 200:1) needed for current applications (e.g., contact etch or 3D NAND). Additionally, etching today has not been limited to selectivity to the photoresist mask. It is equally important to get high selectivity among other materials such as a-C, SiN, p-Si, SiC or other forms of $Si_aC_bO_cH_dN_e$ materials (where a>0; b, c, d and e≥0).

Thus, a need remains for etch gas compositions suitable for use in plasma etching applications which maintain selectivity and high aspect ratios for a wide range of process conditions.

SUMMARY

Disclosed are methods for plasma etching silicon-containing films. The methods include the steps of: introducing a vapor of an iodine-containing etching compound into a reaction chamber containing a silicon-containing film on a substrate, wherein the iodine-containing etching compound have the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3; introducing an inert gas into the reaction chamber; and activating a plasma to produce an activated iodine-containing etching compound capable of etching the silicon-containing film from the substrate. The disclosed methods may include one or more of the following aspects:

- the iodine-containing etching compound having the formula $CH_xF_yI_z$, wherein x is 0-2, y is 1-3, z is 1-2, and x+y+z=4;
- the iodine-containing etching compound being $CF_3I$;
- the iodine-containing etching compound being $CF_2I_2$;
- the iodine-containing etching compound having the formula $CH_xF_yI_z$, wherein x is 1-2, y is 1-2, z is 1-2, and x+y+z=4;
- the iodine-containing etching compound being $CHF_2I$;
- the iodine-containing etching compound being $CH_2FI$;
- the iodine-containing etching compound being $CHFI_2$;
- the iodine-containing etching compound having the formula $C_2H_xF_yI_z$, wherein x is 0-2, y is 1-3, z is 1-2, and x+y+z=4;
- the iodine-containing etching compound being $C_2F_3I$ and having the structure:

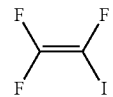

- the iodine-containing etching compound having the formula $C_2H_xF_yI_z$, wherein x is 1-2, y is 1-2, z is 1-2, and x+y+z=4;
- the iodine-containing etching compound being $C_2HF_2I$ and having the structure:

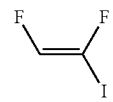

the iodine-containing etching compound being $C_2HF_2I$ and having the structure:

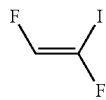

the iodine-containing etching compound being $C_2H_2FI$ and having the structure:

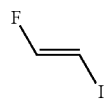

the iodine-containing etching compound being $C_2H_2FI$ and having the structure:

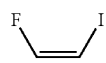

the iodine-containing etching compound having the formula $C_2H_xF_yI_z$, wherein x is 0-4, y is 1-5, z is 1-2, and x+y+z=6;

the iodine-containing etching compound being $C_2H_5I$ and having the structure:

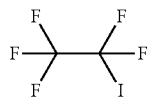

the iodine-containing etching compound having the formula $C_2H_xF_yI_z$, wherein x is 1-4, y is 1-4, z is 1-2, and x+y+z=6;

the iodine-containing etching compound being $C_2HF_4I$ and having the structure:

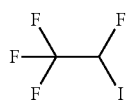

the iodine-containing etching compound being $C_2HF_4I$ and having the structure:

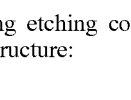

the iodine-containing etching compound being $C_2H_2F_3I$ and having the structure:

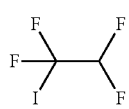

the iodine-containing etching compound being $C_2H_2F_3I$ and having the structure:

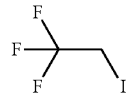

the iodine-containing etching compound being $C_2H_2F_3I$ and having the structure:

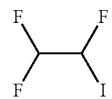

the iodine-containing etching compound being $C_2H_3F_2I$ and having the structure:

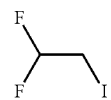

the iodine-containing etching compound being $C_2H_3F_2I$ and having the structure:

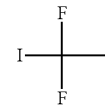

the iodine-containing etching compound being $C_2H_4FI$ and having the structure:

the iodine-containing etching compound being $C_2H_4FI$ and having the structure:

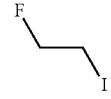

the iodine-containing etching compound being $C_2F_4I_2$ and having the structure:

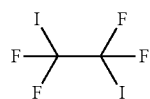

the iodine-containing etching compound being $C_2F_4I_2$ and having the structure:

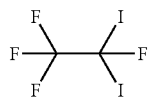

the iodine-containing etching compound having the formula $C_3H_xF_yI_z$, wherein x is 0-4, y is 1-5, z is 1-2, and x+y+z=6;

the iodine-containing etching compound being $C_3F_5I$ and having the structure:

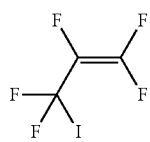

the iodine-containing etching compound having the formula $C_3H_xF_yI_z$, wherein x is 1-4, y is 1-4, z is 1-2, and x+y+z=6;

the iodine-containing etching compound being $C_3HF_4I$ and having the structure:

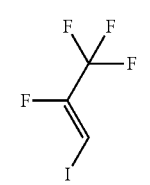

the iodine-containing etching compound being $C_3HF_4I$ and having the structure:

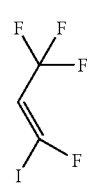

the iodine-containing etching compound being $C_3HF_4I$ and having the structure:

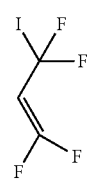

the iodine-containing etching compound being $C_3H_2F_3I$ and having the structure:

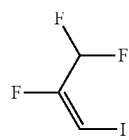

the iodine-containing etching compound being $C_3H_2F_3I$ and having the structure:

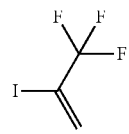

the iodine-containing etching compound being $C_3H_2F_3I$ and having the structure:

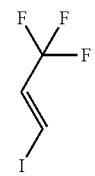

the iodine-containing etching compound being $C_3H_2F_3I$ and having the structure:

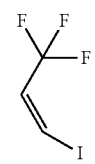

the iodine-containing etching compound having the formula $C_3H_xF_yI_z$, wherein x is 0-6, y is 1-7, z is 1-2, and x+y+z=8;

the iodine-containing etching compound being $C_3F_7I$ and having the structure:

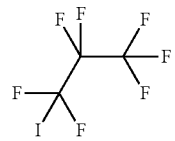

the iodine-containing etching compound being $C_3F_7I$ and having the structure:

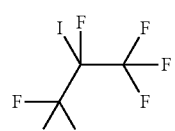

the iodine-containing etching compound having the formula $C_3H_xF_yI_z$, wherein x is 1-6, y is 1-6, z is 1-2, and x+y+z=8;

the iodine-containing etching compound being $C_3HF_6I$ and having the structure:

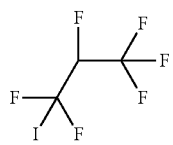

the iodine-containing etching compound being $C_3HF_6I$ and having the structure:

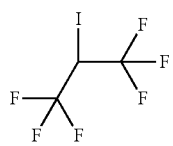

the iodine-containing etching compound being $C_3H_2F_5I$ and having the structure:

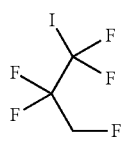

the iodine-containing etching compound being $C_3H_2F_5I$ and having the structure:

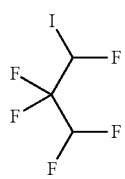

the iodine-containing etching compound being $C_3H_2F_5I$ and having the structure:

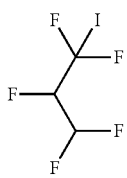

the iodine-containing etching compound being $C_3H_2F_5I$ and having the structure:

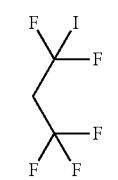

the iodine-containing etching compound being $C_3H_2F_5I$ and having the structure:

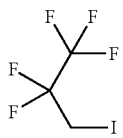

the iodine-containing etching compound being $C_3H_3F_4I$ and having the structure:

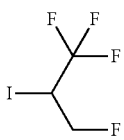

the iodine-containing etching compound being $C_3H_3F_4I$ and having the structure:

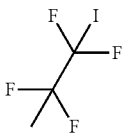

the iodine-containing etching compound being $C_3H_3F_4I$ and having the structure:

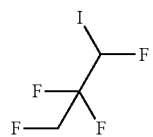

the iodine-containing etching compound being $C_3H_3F_4I$ and having the structure:

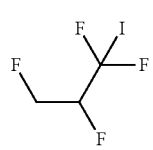

the iodine-containing etching compound being $C_3H_3F_4I$ and having the structure:

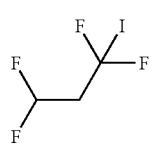

the iodine-containing etching compound being $C_3H_3F_4I$ and having the structure:

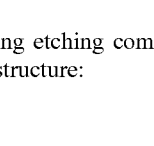

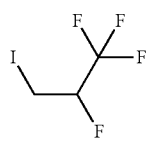

the iodine-containing etching compound being $C_3H_3F_4I$ and having the structure:

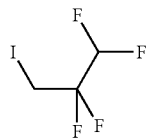

the iodine-containing etching compound being $C_3H_3F_4I$ and having the structure:

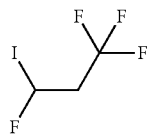

the iodine-containing etching compound being $C_3H_4F_3I$ and having the structure:

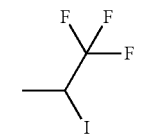

the iodine-containing etching compound being $C_3H_4F_3I$ and having the structure:

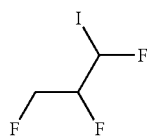

the iodine-containing etching compound being $C_3H_4F_3I$ and having the structure:

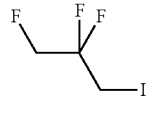

the iodine-containing etching compound being $C_3H_4F_3I$ and having the structure:

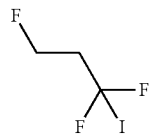

the iodine-containing etching compound being $C_3H_4F_3I$ and having the structure:

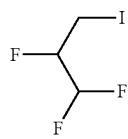

the iodine-containing etching compound being $C_3H_4F_3I$ and having the structure:

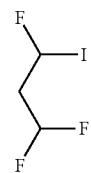

the iodine-containing etching compound being $C_3H_4F_3I$ and having the structure:

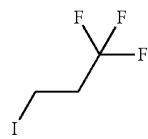

the activated iodine-containing etching compound reacting with the silicon-containing film to form volatile by-products;
the volatile by-products being removed from the reaction chamber;
the inert gas being selected from the group consisting of He, Ar, Xe, Kr, and Ne;
the inert gas being Ar;
mixing the vapor of the iodine-containing etching compound and the inert gas prior to introduction to the reaction chamber to produce a mixture;
introducing the vapor of the iodine-containing etching compound into the reaction chamber separately from the inert gas;
introducing the inert gas continuously into the reaction chamber and introducing the vapor of the iodine-containing etching compound into the reaction chamber in pulses;
the inert gas comprising approximately 0.01% v/v to approximately 99.9% v/v of a total volume of the vapor of the iodine-containing etching compound and inert gas introduced into the reaction chamber;
the inert gas comprising approximately 90% v/v to approximately 99% v/v of a total volume of the vapor of the iodine-containing etching compound and inert gas introduced into the reaction chamber;
introducing an oxidizer into the reaction chamber;

not introducing an oxidizer into the reaction chamber;
the oxidizer being selected from the group consisting of $O_2$, CO, $CO_2$, NO, $N_2O$, and $NO_2$;
the oxidizer being $O_2$;
mixing the vapor of the iodine-containing etching compound and the oxidizer prior to introduction into the reaction chamber;
introducing the vapor of the iodine-containing etching compound into the reaction chamber separately from the oxidizer;
introducing the oxidizer continuously into the reaction chamber and introducing the vapor of the iodine-containing etching compound into the reaction chamber in pulses;
the oxidizer comprising approximately 0.01% v/v to approximately 99.9% v/v of a total volume of the vapor of the iodine-containing etching compound and oxidizer introduced into the reaction chamber;
the oxidizer comprising approximately 0.01% v/v to approximately 10% v/v of a total volume of the vapor of the iodine-containing etching compound and oxidizer introduced into the reaction chamber;
the silicon-containing film comprising a layer of silicon oxide, silicon nitride, polysilicon, crystalline silicon, SiON, SiOCH, $Si_aO_bC_cN_dH_e$ (where a>0; b, c, d and e≥0) or combinations thereof;
the silicon-containing film comprising oxygen atoms, nitrogen atoms, carbon atoms, hydrogen atoms or combinations thereof;
the silicon-containing film comprising silicon carbide;
the silicon-containing film being selectively etched from an a-C layer;
the silicon-containing film being selectively etched from a photoresist layer;
the silicon-containing film being selectively etched from a silicon nitride layer;
the silicon-containing film being selectively etched from a polysilicon layer;
the silicon-containing film being selectively etched from a crystalline silicon layer;
the silicon-containing film being selectively etched from a metal contact layer;
the silicon-containing film being selectively etched from a Titanium Nitride layer;
the silicon-containing film being selectively etched from a Tantalum layer;
the silicon-containing film being a silicon oxide layer;
selectively etching the silicon oxide layer from an a-C layer;
selectively etching the silicon oxide layer from a photoresist layer;
selectively etching the silicon oxide layer from a p-Si layer;
selectively etching the silicon oxide layer from a crystalline silicon layer;
selectively etching the silicon oxide layer from a metal contact layer;
selectively etching the silicon oxide layer from a SiN layer;
the silicon-containing film being a silicon nitride layer;
selectively etching the silicon nitride layer from an a-C layer;
selectively etching the silicon nitride layer from a patterned photoresist layer;
selectively etching the silicon nitride layer from a p-Si layer;
selectively etching the silicon nitride layer from a crystalline silicon layer;
selectively etching the silicon nitride layer from a metal contact layer;
selectively etching the silicon nitride layer from a silicon oxide layer;
the silicon-containing film being a SiON layer;
selectively etching the SiON layer from photoresist layer;
the silicon-containing film being a SiCOH layer;
selectively etching the SiCOH layer from titanium nitride layer;
selectively etching the SiCOH layer from a-C layer;
selective etching the SiCOH layer from photoresist layer;
the silicon-containing film being alternating silicon oxide and silicon nitride layers;
etching both silicon oxide and silicon nitride layers at similar etch rates;
selectively etching both silicon oxide and silicon nitride layers from a silicon layer;
selectively etching both silicon oxide and silicon nitride layers from a p-Si layer;
selectively etching both silicon oxide and silicon nitride layers from a crystalline silicon layer;
selectively etching both silicon oxide and silicon nitride layers from an a-C layer;
the silicon-containing film being alternating silicon oxide and p-Si layers;
etching both silicon oxide and p-Si layers at similar etch rates;
selectively etching both silicon oxide and p-Si layers from an a-C layer;
selectively etching both silicon oxide and p-Si layers from a silicon nitride layer;
producing an aperture in the silicon-containing film having an aspect ratio between approximately 10:1 and approximately 200:1;
producing a gate trench;
producing a staircase contact;
producing a channel hole;
producing a channel hole having an aspect ratio between approximately 60:1 and approximately 100:1;
producing a channel hole having a diameter ranging from approximately 5 nm to approximately 100 nm;
producing a channel hole having a diameter ranging from approximately 10 nm to approximately 50 nm;
improving selectivity by introducing an etch gas into the reaction chamber;
the etch gas being selected from the group consisting of $cC_4F_8$, $cC_5F_8$, $C_4F_6$, $CF_4$, $CH_3F$, $CF_3H$, $CH_2F_2$, COS, F—C≡N, $CS_2$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$);
the etch gas being $cC_5F_8$;
the etch gas being $cC_4F_8$;
the etch gas being $C_4F_6$;
mixing the vapor of the iodine-containing etching compound and the etch gas prior to introduction to the reaction chamber;
introducing the vapor of the iodine-containing etching compound into the reaction chamber separately from the etch gas;
introducing approximately 0.01% v/v to approximately 99.99% v/v of the etch gas into the reaction chamber;

activating the plasma by applying RF power;
activating the plasma by a RF power ranging from approximately 25 W to approximately 10,000 W;
the reaction chamber having a pressure ranging from approximately 1 mTorr to approximately 10 Torr;
introducing the vapor of the iodine-containing etching compound into the reaction chamber at a flow rate ranging from approximately 0.1 sccm to approximately 1 slm;
maintaining the substrate at a temperature ranging from approximately −196° C. to approximately 500° C.;
maintaining the substrate at a temperature ranging from approximately −120° C. to approximately 300° C.;
maintaining the substrate at a temperature ranging from approximately −100° C. to approximately 50° C.;
maintaining the substrate at a temperature ranging from approximately −10° C. to approximately 40° C.; and
measuring the activated iodine-containing etching compound by Quadrupole mass spectrometer, optical emission spectrometer, FTIR, or other radical/ion measurement tool.

Also disclosed are iodine-containing etching compounds having the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3. The disclosed iodine-containing etching compounds include one or more of the following aspects:

the iodine-containing etching compound having the formula $CH_xF_yI_z$, wherein x is 0-2, y is 1-3, z is 1-2, and x+y+z=4;
the iodine-containing etching compound being $CF_3I$;
the iodine-containing etching compound being $CF_2I_2$;
the iodine-containing etching compound having the formula $CH_xF_yI_z$, wherein x is 1-2, y is 1-2, z is 1-2, and x+y+z=4;
the iodine-containing etching compound being $CHF_2I$;
the iodine-containing etching compound being $CH_2FI$;
the iodine-containing etching compound being $CHFI_2$;
the iodine-containing etching compound having the formula $C_2H_xF_yI_z$, wherein x is 0-2, y is 1-3, z is 1-2, and x+y+z=4;
the iodine-containing etching compound being $C_2F_3I$ and having the structure:

the iodine-containing etching compound having the formula $C_2H_xF_yI_z$, wherein x is 1-2, y is 1-2, z is 1-2, and x+y+z=4;
the iodine-containing etching compound being $C_2HF_2I$ and having the structure:

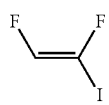

the iodine-containing etching compound being $C_2HF_2I$ and having the structure:

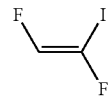

the iodine-containing etching compound being $C_2H_2FI$ and having the structure:

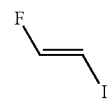

the iodine-containing etching compound being $C_2H_2FI$ and having the structure:

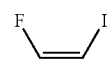

the iodine-containing etching compound having the formula $C_2H_xF_yI_z$, wherein x is 0-4, y is 1-5, z is 1-2, and x+y+z=6;
the iodine-containing etching compound being $C_2H_5I$ and having the structure:

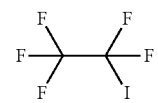

the iodine-containing etching compound having the formula $C_2H_xF_yI_z$, wherein x is 1-4, y is 1-4, z is 1-2, and x+y+z=6;
the iodine-containing etching compound being $C_2HF_4I$ and having the structure:

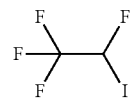

the iodine-containing etching compound being $C_2HF_4I$ and having the structure:

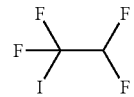

the iodine-containing etching compound being $C_2H_2F_3I$ and having the structure:

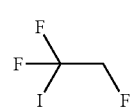

the iodine-containing etching compound being $C_2H_2F_3I$ and having the structure:

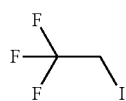

the iodine-containing etching compound being $C_2H_2F_3I$ and having the structure:

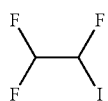

the iodine-containing etching compound being $C_2H_3F_2I$ and having the structure:

the iodine-containing etching compound being $C_2H_3F_2I$ and having the structure:

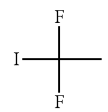

the iodine-containing etching compound being $C_2H_4FI$ and having the structure:

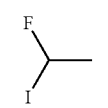

the iodine-containing etching compound being $C_2H_4FI$ and having the structure:

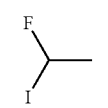

the iodine-containing etching compound being $C_2F_4I_2$ and having the structure:

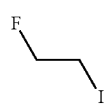

the iodine-containing etching compound being $C_2F_4I_2$ and having the structure:

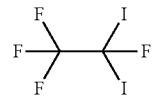

the iodine-containing etching compound having the formula $C_3H_xF_yI_z$, wherein x is 0-4, y is 1-5, z is 1-2, and x+y+z=6;

the iodine-containing etching compound being $C_3F_5I$ and having the structure:

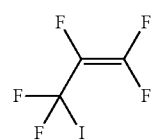

the iodine-containing etching compound having the formula $C_3H_xF_yI_z$, wherein x is 1-4, y is 1-4, z is 1-2, and x+y+z=6;

the iodine-containing etching compound being $C_3HF_4I$ and having the structure:

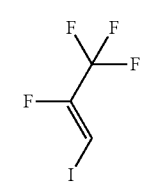

the iodine-containing etching compound being $C_3HF_4I$ and having the structure:

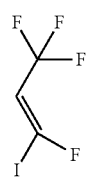

the iodine-containing etching compound being $C_3HF_4I$ and having the structure:

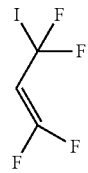

the iodine-containing etching compound being $C_3H_2F_3I$ and having the structure:

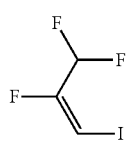

the iodine-containing etching compound being $C_3H_2F_3I$ and having the structure:

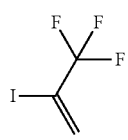

the iodine-containing etching compound being $C_3H_2F_3I$ and having the structure:

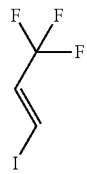

the iodine-containing etching compound being $C_3H_2F_3I$ and having the structure:

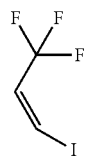

the iodine-containing etching compound having the formula $C_3H_xF_yI_z$, wherein x is 0-6, y is 1-7, z is 1-2, and x+y+z=8;

the iodine-containing etching compound being $C_3F_7I$ and having the structure:

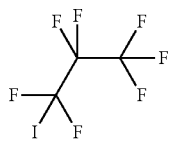

the iodine-containing etching compound being $C_3F_7I$ and having the structure:

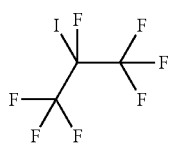

the iodine-containing etching compound having the formula $C_3H_xF_yI_z$, wherein x is 1-6, y is 1-6, z is 1-2, and x+y+z=8;

the iodine-containing etching compound being $C_3HF_6I$ and having the structure:

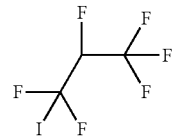

the iodine-containing etching compound being $C_3HF_6I$ and having the structure:

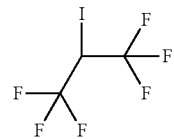

the iodine-containing etching compound being $C_3H_2F_5I$ and having the structure:

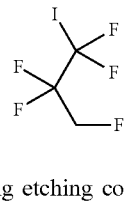

the iodine-containing etching compound being $C_3H_2F_5I$ and having the structure:

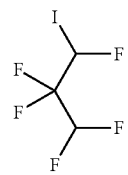

the iodine-containing etching compound being $C_3H_2F_5I$ and having the structure:

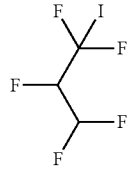

the iodine-containing etching compound being $C_3H_2F_5I$ and having the structure:

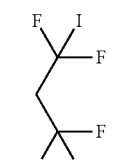

the iodine-containing etching compound being $C_3H_2F_4I$ and having the structure:

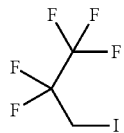

the iodine-containing etching compound being $C_3H_3F_4I$ and having the structure:

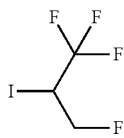

the iodine-containing etching compound being $C_3H_3F_4I$ and having the structure:

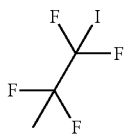

the iodine-containing etching compound being $C_3H_3F_4I$ and having the structure:

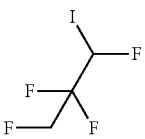

the iodine-containing etching compound being $C_3H_3F_4I$ and having the structure:

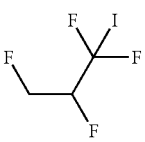

the iodine-containing etching compound being $C_3H_3F_4I$ and having the structure:

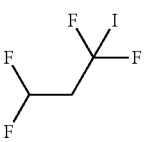

the iodine-containing etching compound being $C_3H_3F_4I$ and having the

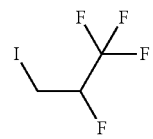

the iodine-containing etching compound being $C_3H_3F_4I$ and having the structure:

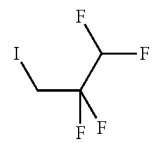

the iodine-containing etching compound being $C_3H_3F_4I$ and having the structure:

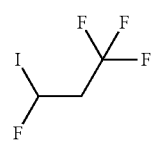

the iodine-containing etching compound being $C_3H_4F_3I$ and having the structure:

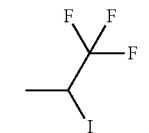

the iodine-containing etching compound being $C_3H_4F_3I$ and having the structure:

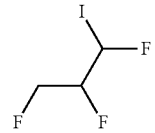

the iodine-containing etching compound being $C_3H_4F_3I$ and having the structure:

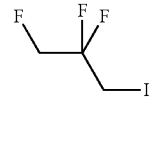

the iodine-containing etching compound being $C_3H_4F_3I$ and having the structure:

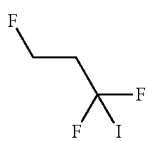

the iodine-containing etching compound being $C_3H_4F_3I$ and having the structure:

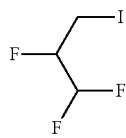

the iodine-containing etching compound being $C_3H_4F_3I$ and having the structure:

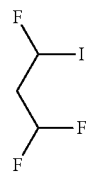

the iodine-containing etching compound being $C_3H_4F_3I$ and having the structure:

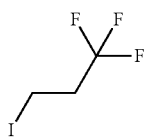

having a purity ranging from approximately 95% to approximately 99.999% by volume;
comprising between approximately 10 parts per trillion to approximately 5% by volume trace gas impurities;
the trace gas impurities comprising water;
the trace gas impurities comprising $CO_2$;
the trace gas impurities comprising $N_2$; and
the iodine-containing etching compound having a water content of less than 20 ppmw.

NOTATION AND NOMENCLATURE

The following detailed description and claims utilize a number of abbreviations, symbols, and terms, which are generally well known in the art. While definitions are typically provided with the first instance of each acronym, for convenience, Table 1 provides a list of the abbreviations, symbols, and terms used along with their respective definitions.

TABLE 1

| | |
|---|---|
| a or an | one or more than one |
| approximately or about | ±10% of the value stated |
| LCD-TFT | liquid-crystal display-thin-film transistor |
| DRAM | dynamic random-access memory |

TABLE 1-continued

| | |
|---|---|
| FINFET | fin-shaped field-effect transistor |
| Bulk CMOS | Bulk complementary metal-oxide-semiconductor |
| FD-SOI | fully depleted silicon-on-insulator |
| FEOL | front end of the line |
| BEOL | back end of the line |
| TSV | through silicon via |
| OLED | organic light-emitting diode |
| RIE | reactive ion etching |
| CCP | capacitively coupled plasma |
| ICP | inductively coupled plasma |
| sccm | standard cubic centimeters per minute |
| slm | standard liter per minute |
| ONON | silicon oxide and silicon nitride alternating layers |
| TCAT | terabit cell array transistor |
| P-BICS | pipe-shaped bit cost scalable |
| QMS | Quadrupole mass spectrometer |
| ARC or BARC | Anti-reflecting coating or Bottom anti-reflecting coating |
| APF or a-C | Amorphous carbon. Trademark of Applied Materials |
| CAS | chemical abstract service |
| PCTFE | Polychlorotrifluoroethene |
| PVDF | polyvinylidene fluoride |
| PTFE | Polytetrafluoroethylene |
| SEM | scanning electron microscope |
| NAND | Not AND or Negative-NAND or Negated AND |
| TEOS | Tetraethylorthosilicate |
| LDTEOS | low deposition rate TEOS |
| BPSG | Borophosphosilicateglass |
| p-Si | poly-silicon |
| XPS | X-ray photoelectron spectroscopy |
| SiN | Silicon nitride |
| SiO | Silicon oxide |

As used herein, the term "etch" or "etching" means to use a plasma to remove material via ion bombardment, remote plasma, or chemical vapor reaction between the etching gas and substrate. The etch process may be anisotropic or isotropic. The etching process produces apertures, such as vias, trenches, channel holes, gate trenches, staircase contacts, capacitor holes, contact holes, etc., in the substrate.

The term "pattern etch" or "patterned etch" refers to etching a non-planar structure, such as a patterned mask layer on a stack of silicon-containing films.

The term "mask" refers to a layer that resists etching. The mask layer may be located above the layer to be etched.

The term "etch stop layer" refers to a layer below the layer to be etched that protects layers underneath.

The term "device channel" refers to layers that are part of actual device and any damage to it will affect device performance.

The term "aspect ratio" refers to a ratio of the height of a trench (or via) to the width of the trench (or the diameter of the via).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably. It is understood that an etching compound may correspond to, or related to an etching gas, and that the etching gas may refer to the etching compound.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviations (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to help better identify the molecules disclosed.

Please note that the silicon-containing films, such as silicon nitride and silicon oxide, are listed throughout the specification and claims without reference to their proper stoichoimetry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Preferably silicon oxide is $Si_nO_m$, where n ranges from 0.5 to 1.5 and m ranges from 1.5 to 3.5. More preferably, silicon oxide is $SiO_2$. Herein, SiN and SiO in the following description are used to represent $Si_kN_l$ and $Si_nO_m$ containing layers, respectively. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
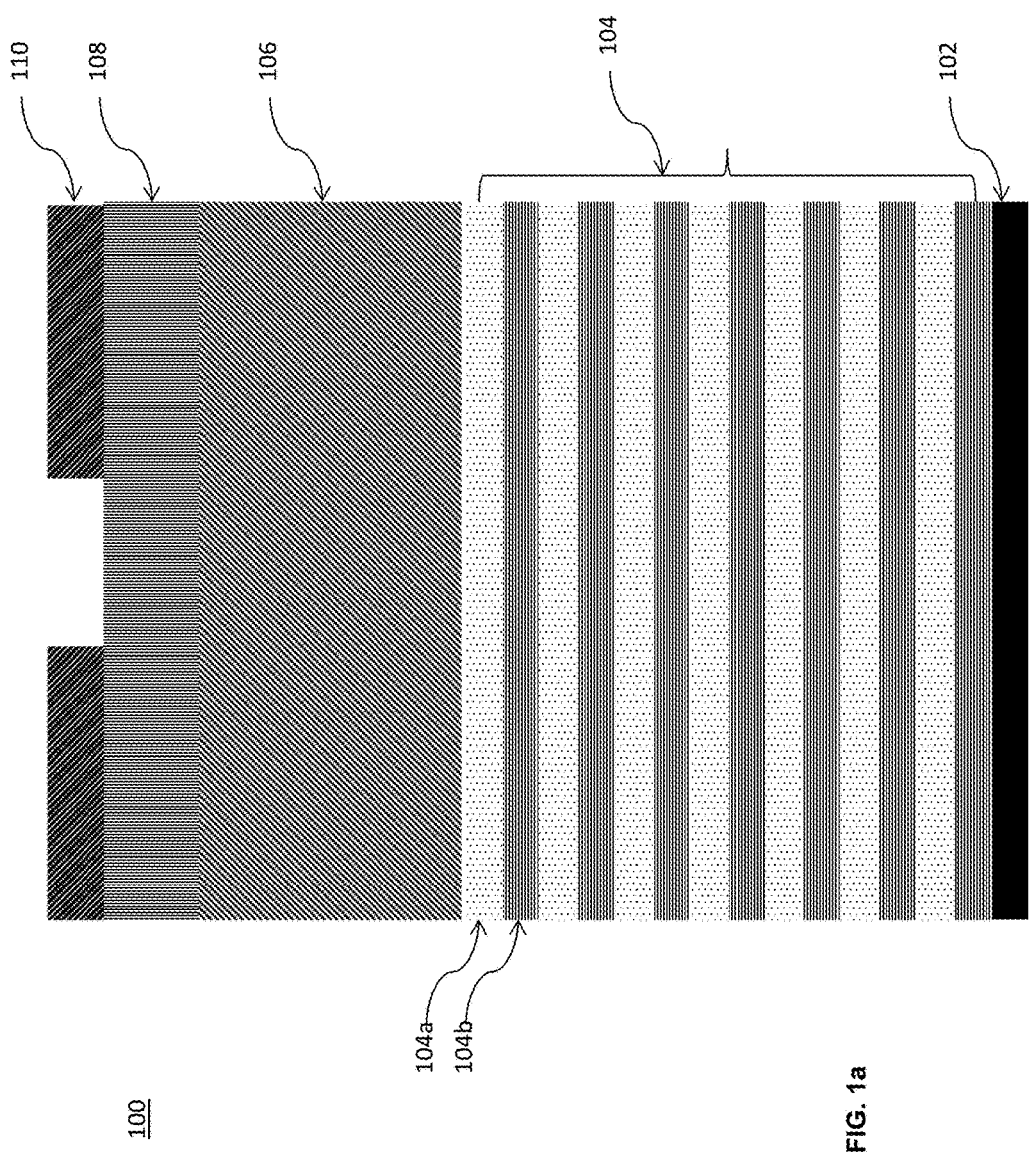
FIG. 1a is a cross-sectional side view of exemplary layers in a 3D NAND stack.

Disclosed are methods for plasma etching semiconductor structures, such as, channel holes, gate trenches, staircase contacts, capacitor holes, contact holes, etc., in silicon-containing films. The disclosed methods include the steps of i) introducing a vapor of an iodine-containing etching compound into a reaction chamber containing a silicon-containing film on a substrate, wherein the iodine-containing etching compound has the formula $C_aH_xF_yI_z$, wherein a=1-3, x=0-6, y=1-7, z=1-2, x+y+z=4 when a=1, x+y+z=4 or 6 when a=2, and x+y+z=6 or 8 when a=3; ii) introducing an inert gas into the reaction chamber; and iii) activating a plasma to produce an activated iodine-containing etching compound capable of etching the silicon-containing film from the substrate.

As shown in the examples that follow, the iodide ion of the disclosed iodine-containing etching compounds dissociates from the compounds at low energies (eV) (i.e., <20 eV). As a result, Applicants believe that the disclosed etching compounds may be used in dry plasma etch processes that produce less damage to the underlying substrates because they can be performed at lower plasma energies. For example, the disclosed iodine-containing etching compounds may be particularly suitable for low k etch processes in which damage is a particular concern because lower plasma energy may produce less damage to the porous low k material surrounding the etch site. The disclosed iodine-containing etching compounds may also prevent loss of the critical dimension and decrease low k surface roughness. In addition, molecules with two iodine atoms may enhance these benefits, although at a loss of volatility due to the size of the iodine atoms.

Iodine (10.5 eV) has a lower ionization threshold than Fluorine (17.4 eV) and the inert gases: Ar (15.8 eV), Xe (12.1 eV), and Kr (14 eV). Iodine may therefore be more easily ionized by the plasma than fluorine. Iodine may also behave similarly to the inert gases in the plasma and accelerate towards the wafer. Fluorine's ionization threshold serves to maintain it as a neutral species. As a result, fluorine typically participates in the etching process via chemical reactions. Iodine exhibits less chemical reactivity than fluorine and is ionized and bombards the surface during the plasma etch process. The bond energy for C—I is also less than the bond energy for C—F, thereby causing the C—I bond to more easily break in the plasma compared to C—F bonds.

As shown in the examples that follow, the iodide ion dissociates from the disclosed etching compounds at low eVs (i.e., <20 eV). The resulting iodide ion may be too large to enter features having narrow widths or diameters. However, iodide ion implantation into the mask feature is likely. This implantation may help to strengthen the mask feature and help it maintain its shape during the etching process.

The disclosed iodine-containing etching compounds have the formula $C_aH_xF_yI_z$, wherein $a=1$-$3$, $x=0$-$6$, $y=1$-$7$, $z=1$-$2$, $x+y+z=4$ when $a=1$, $x+y+z=4$ or $6$ when $a=2$, and $x+y+z=6$ or $8$ when $a=3$. Exemplary iodine-containing etching compounds are listed in Table 2. These molecules are commercially available or may be synthesized by methods known in the art. Their structure formula, CAS numbers and boiling points are included in Table 2.

TABLE 2

Commercially available etching compounds

| Etching compounds | Formula | Structure | CAS number | Boiling point (° C.)* |
|---|---|---|---|---|
| Trifluoroiodo-methane | $CF_3I$ | | 2314-97-8 | −22.5 |
| Difluorodiiodo-methane | $CF_2I_2$ | | 1184-76-5 | ~89 |
| Difluoroiodo-methane | $CHF_2I$ | | 1493-03-4 | 21.6 |
| Fluoroiodo-methane | $CH_2FI$ | | 373-53-5 | 53.4 |
| 1,1,2-trifluoro-2-iodo-ethene | $C_2F_3I$ | | 359-37-5 | 30 |
| 1,2-difluoro-1-iodo-ethene (1E)-1,2-difluoro-1-iodo-ethene | $C_2HF_2I$ | | 2925-16-8 183106-80-1 | 35.5 ~51 |
| (1Z)-1,2-difluoro-1-iodo-ethene | $C_2HF_2I$ | | 122652-71-5 | 44-45 |
| 1-fluoro-2-iodo-ethene (E)-1-fluoro-2-iodo-ethene | $C_2H_2FI$ | | 2353-82-4 | 64-65 |
| (Z)-1-fluoro-2-iodo-ethene | $C_2H_2FI$ | | 3794-12-5 | 74-75 |
| 1,1,1,2,2-penta-2-iodoethane | $C_2F_5I$ | | 354-64-3 | 13 |
| 1,1,1,2-tetrafluoro-2-iodo-ethane | $C_2HF_4I$ | | 3831-49-0 | ~39 |
| 1,1,2,2-tetrafluoro-1-iodo-ethane | $C_2HF_4I$ | | 354-41-6 | ~41 |
| 1,1,2-trifluoro-1-iodo-ethane | $C_2H_2F_3I$ | | 20705-05-9 | ~58 |
| 1,1,1-trifluoro-2-iodo-ethane | $C_2H_2F_3I$ | | 353-83-3 | 54.5 |
| 1,1,2-trifluoro-2-iodo-ethane | $C_2H_2F_3I$ | | 116239-01-1 | ~71 |
| 1,1-difluoro-2-iodo-ethane | $C_2H_2F_3I$ | | 598-39-0 | 86.8-87.1 |

TABLE 2-continued

Commercially available etching compounds

| Etching compounds | Formula | Structure | CAS number | Boiling point (° C.)* |
|---|---|---|---|---|
| 1,1-difluoro-1-iodo-ethane | $C_2H_3F_2I$ | | 420-47-3 | 45 |
| 1-fluoro-1-iodo-ethane | $C_2H_4FI$ | | 87508-83-6 | ~68 |
| 1-fluoro-2-iodo-ethane | $C_2H_4FI$ | | 762-51-6 | 98-102 |
| 1,1,2,2-tetrafluoro-1,2-diodo-ethane | $C_2F_4I_2$ | | 354-65-412 | 112 |
| 1,1,2,3,3-pentafluoro-3-iodo-1-propene | $C_3F_5I$ | | 431-65-2 | 53.4 |
| 2,3,3,3-tetrafluoro-1-iodo-1-propene | $C_3HF_4I$ | | 885275-66-1 | ~56 |
| 1,3,3,3-tetrafluoro-1-iodo-1-propene | $C_3HF_4I$ | | 113612-33-2 | ~115 |
| 1,1,3,3-tetrafluoro-3-iodo-1-propene | $C_3HF_4I$ | | 674-03-3 | 61.2 |
| 2,3,3-trifluoro-1-iodo-1-propene | $C_3H_2F_3I$ | | 11706949-64-5 | ~85 |
| 3,3,3-trifluoro-2-iodo-1-propene | $C_3H_2F_3I$ | | 107070-09-7 | ~108 |
| 3,3,3-trifluoro-1-iodo-1-propene (1E) 3,3,3-trifluoro-1-iodo-1-propene | $C_3H_2F_3I$ | | 460-38-8 157430-70-1 | 70.2 ~118 |
| (Z) 3,3,3-trifluoro-1-iodo-1-propene | $C_3H_2F_3I$ | | 157430-72-3 | ~118 |
| 1,1,1,2,2,3,3-heptafluoro-3-iodopropane | $C_3F_7I$ | | 754-34-7 | 41.2 |
| 1,1,1,2,3,3,3-heptafluoro-2-iodopropane | $C_3F_7I$ | | 677-69-0 | 40 |
| 1,1,1,2,3,3-hexafluoro-3-iodo-propane | $C_3HF_6I$ | | 431-90-3 | ~58 |
| 1,1,1,3,3,3-hexafluoro-2-iodo-propane | $C_3HF_6I$ | | 4141-91-7 | 58 |
| 1,1,2,2,3-pentafluoro-1-iodo-propane | $C_3H_2F_5I$ | | 58777-36-9 | ~76 |
| 1,1,2,2,3-pentafluoro-3-iodo-propane | $C_3H_2F_5I$ | | 58706-53-9 | ~88 |
| 1,1,2,3,3-pentafluoro-1-iodo-propane | $C_3H_2F_5I$ | | 58706-52-8 | ~83 |

TABLE 2-continued

Commercially available etching compounds

| Etching compounds | Formula | CAS number | Boiling point (° C.)* |
|---|---|---|---|
| 1,1,1,3,3-pentafluoro-3-iodo-propane | $C_3H_2F_5I$ | 371-75-5 | ~66 |
| 1,1,1,2,2-pentafluoro-3-iodo-propane | $C_3H_2F_5I$ | 354-69-8 | 70.5 |
| 1,1,1,3-tetrafluoro-2-iodo-propane | $C_3H_3F_4I$ | 1902966-92-0 | ~93 |
| 1,1,2,2-tetrafluoro-1-iodo-propane | $C_3H_3F_4I$ | 190589-09-4 | ~62 |
| 1,2,2,3-tetrafluoro-1-iodo-propane | $C_3H_3F_4I$ | 58777-35-8 | ~103 |
| 1,1,2,3-tetrafluoro-1-iodo-propane | $C_3H_3F_4I$ | 58777-34-7 | ~95 |
| 1,1,3,3-tetrafluoro-1-iodo-propane | $C_3H_3F_4I$ | 58706-49-3 | ~89 |
| 1,1,1,2-tetrafluoro-3-iodo-propane | $C_3H_3F_4I$ | 1737-76-4 | ~87 |
| 1,1,2,2-tetrafluoro-3-iodo-propane | $C_3H_3F_4I$ | 679-87-8 | 95 |
| 1,1,1,3-tetrafluoro-3-iodo-propane | $C_3H_3F_4I$ | 460-74-2 | 86.2 |
| 1,1,1-trifluoro-2-iodo-propane | $C_3H_4F_3I$ | 118334-95-5 | ~74 |
| 1,2,3-trifluoro-1-iodo-propane | $C_3H_4F_3I$ | 909717-19-7 | ~122 |
| 1,2,2-trifluoro-3-iodo-propane | $C_3H_4F_3I$ | 58777-33-6 | ~116 |
| 1,1,3-trifluoro-1-iodo-propane | $C_3H_4F_3I$ | 58777-32-5 | ~98 |
| 1,1,2-trifluoro-3-iodo-propane | $C_3H_4F_3I$ | 58706-46-0 | ~117 |
| 1,1,3-trifluoro-3-iodo-propane | $C_3H_4F_3I$ | 58706-45-9 | ~112 |
| 1,1,1-trifluoro-3-iodo-propane | $C_3H_4F_3I$ | 460-37-7 | 90 |

"~" indicates boiling points that have been predicted by the SciFinder database

When a=1, the disclosed iodine-containing etching compounds have the formula $CH_xF_yI_z$, wherein x=0-2, y=1-2, z=1-2, x+y+z=4. Exemplary compounds include $CF_3I$, $CF_2I_2$, $CHF_2I$, $CH_2FI$, and $CHFI_2$. Applicants believe that the etch rate of SiN may be enhanced while maintaining high selectivity to the mask layer when the disclosed iodine-containing etching compounds include at least one H. Iodine-containing etching compounds having one H when a=1 have the formula $CH_xF_yI_z$, wherein x=1-2, y=1-2, and z=1-2. Exemplary compounds include $CHF_2I$, $CH_2FI$, and $CHFI_2$.

Applicants believe that the molecules having 2-3 carbon atoms may provide better sidewall protection during the etching process than the C1 molecules.

For sidewall protection, the C3 molecules are preferred because Applicants believe they will produce thicker passivation layers. C3 iodine-containing etching compounds have the formula $C_3H_xF_yI_z$, wherein x=0-6, y=1-7, z=1-2, and x+y+z=6 or 8. Exemplary C3 iodine-containing etching compounds include $C_3F_5I$, $C_3HF_4I$, $C_3H_2F_3I$, $C_3F_7I$, $C_3HF_6I$, $C_3H_2F_5I$, $C_3H_3F_4I$, and $C_3H_4F_3I$.

However, the C2 molecules may be easier to deliver to the reactor or, for some applications, thinner passivation layers may be desired. C2 iodine-containing etching compounds have the formula $C_2H_xF_yI_z$, wherein x=0-4, y=1-5, z=1-2, and x+y+z=4 or 6. Exemplary C2 iodine-containing etching compounds include $C_2F_3I$, $C_2HF_2I$, $C_2H_2FI$, $C_2F_5I$, $C_2HF_4I$, $C_2H_2F_3I$, $C_2H_3F_2I$, $C_2H_4FI$, and $C_2F_4I_2$, and preferably $C_2HF_2I$, $C_2HF_4I$, or 1,1-difluoro-1-iodo-ethane.

Applicants further believe that the etch rate of SiN may be enhanced while maintaining high selectivity to the mask layer when the disclosed iodine-containing etching compounds include at least one H (i.e., $C_2HF_2I$, $C_2HF_4I$, $C_2H_2F_3I$, $C_2H_3F_2I$, $C_2H_4FI$, $C_3HF_4I$, $C_3H_2F_3I$, $C_3H_2F_5I$, $C_3H_3F_4I$, and $C_3H_4F_3I$).

Once again, the C3 molecules are preferred for sidewall protection. C3 iodine-containing etching compounds containing one H have the formula $C_3H_xF_yI_z$, wherein x=1-6, y=1-6, z=1-2, and x+y+z=6 or 8. Exemplary molecules include $C_3HF_4I$, $C_3H_2F_3I$, $C_3HF_6I$, $C_3H_2F_5I$, $C_3H_3F_4I$, and $C_3H_4F_3I$.

But again, the C2 molecules may be easier to deliver to the reactor. C2 iodine-containing etching compounds containing one H have the formula $C_2H_xF_yI_z$, wherein x=1-4, y=1-4, z=1-2, and x+y+z=4 or 6. Exemplary molecules include $C_2HF_2I$, $C_2H_2FI$, $C_2HF_4I$, $C_2H_2F_3I$, $C_2H_3F_2I$, and $C_2H_4FI$, and preferably $C_2HF_2I$, $C_2HF_4I$, or 1,1-difluoro-1-iodo-ethane.

The disclosed iodine-containing etching compounds may provide high selectivity to mask layers, etch stop layers and device channel materials and no profile distortion in high aspect ratio structures, such as those having an aspect ratio ranging from 10:1 to 200:1 such as DRAM and 3D NAND applications. Alternatively, the disclosed iodine-containing etching compounds may also provide high selectivity to mask layers or silicon nitride, such as those having an aspect ratio ranging from 1:1 to 50:1 in contact etch applications.

The disclosed iodine-containing etching compounds may provide infinite selectivity for wide process conditions of etching. Herein the selectivity refers to the etching rate ratio of two different layers. For example, the selectivity for SiO layer vs. a-C layer is the etch rate of the SiO divided by the etching rate of the a-C layer. The disclosed iodine-containing etching compounds may provide improved selectivity between the silicon-containing films and mask materials, less damage to channel region, and reduced bowing in pattern high aspect ratio structures. The disclosed iodine-containing etching compounds may also etch through alternating layers of p-Si, SiO, and/or SiN, resulting in a vertical etch profile (i.e., demonstrating selectivity ranging from 2:1 to 1:2 between the alternating layers).

The disclosed iodine-containing etching compounds are provided at greater than 95% v/v purity, preferably at greater than 99.99% v/v purity, and more preferably at greater than 99.999% v/v purity. The disclosed iodine-containing etching compounds contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppmw by weight. The purified product may be produced by distillation and/or passing the gas or liquid through a suitable adsorbent, such as a 4A molecular sieve.

The disclosed iodine-containing etching compounds contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

Alternatively, the disclosed iodine-containing etching compounds may contain between 5% v/v and 50% v/v of its isomers, particularly when the isomer mixture provides improved process parameters or if isolation of the target isomer is too difficult or expensive. For example, the disclosed iodine-containing etching compounds may comprise between approximately 50% v/v and approximately 75% v/v (1E)-1,2-difluoro-1-iodo-ethene and between approximately 25% v/v and approximately 50% v/v (1Z)-1,2-difluoro-1-iodo-ethene. The mixture of isomers may also reduce the need for two or more gas lines to the reaction chamber.

Some of the disclosed iodine-containing etching compounds are gaseous at room temperature and atmospheric pressure. For the non-gaseous (i.e., liquid or solid) compounds, their gas form may be produced by vaporizing the compounds through a conventional vaporization step, such as direct vaporization or by bubbling with inert gas ($N_2$, Ar, He). The non-gaseous compounds may be fed in liquid state to a vaporizer where it is vaporized before it is introduced into a reactor.

The disclosed iodine-containing etching compounds are suitable for plasma etching semiconductor structures, such as, channel holes, gate trenches, staircase contacts, capacitor holes, contact holes, etc., in the silicon-containing films. The disclosed iodine-containing etching compounds are not only compatible with currently available mask materials but also compatible with the future generations of mask materials because the disclosed iodine-containing etching compounds induce little to no damage on the mask along with good profile of high aspect ratio structures. In other words, the disclosed iodine-containing etching compounds may produce vertical etched patterns having minimal to no bowing, pattern collapse, or roughness. In order to achieve these properties, the disclosed iodine-containing etching compounds may deposit an etch-resistant polymer layer during etching to help reduce the direct impact of the oxygen and fluorine radicals during the etching process. The disclosed iodine-containing etching compounds may also reduce damage to p-Si or crystalline Si channel structure during etching. Preferably, the disclosed iodine-containing etching compounds are suitably volatile and stable during the etching process for delivery into the reactor/chamber.

Material compatibility tests are important to determine if any of the disclosed iodine-containing etching compounds will react with chamber materials and degrade the performance of the chamber with short term or long term use. Key materials involved in parts of the chamber, valves, etc. include stainless steel, aluminum, nickel, PCTFE, PVDF, PTFE and other metals and polymers. At times these materials are exposed to high temperatures, for example, higher than 20° C., and high pressures, for example, higher than 1 atm, which may enhance their degradation. The metrology methods may include visual inspection, weight measurement, measuring nanometer scale changes in scanning electron microscopy (SEM), tensile strength, hardness, etc.

The disclosed iodine-containing etching compounds may be used to plasma etch silicon-containing films on a substrate. The disclosed plasma etching method may be useful in the manufacture of semiconductor devices such as NAND or 3D NAND gates or Flash or DRAM memory or transistors such as fin-shaped field-effect transistor (FinFET), Bulk complementary metal-oxide-semiconductor (Bulk CMOS), fully depleted silicon-on-insulator (FD-SOI) structures. The disclosed iodine-containing etching compounds may be used in other areas of applications, such as different front end of the line (FEOL) and back end of the line (BEOL) etch applications. Additionally, the disclosed iodine-containing etching compounds may also be used for etching Si in 3D through silicon via (TSV) etch applications for interconnecting memory to logic on a substrate.

The plasma etching method includes providing a reaction chamber having a substrate disposed therein. The reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™. The RF power in such may be pulsed to control plasma properties and thereby improving the etch performance (selectivity and damage) further.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O. radicals. Preferably, the remote plasma may be generated with a power ranging from about 1 kW to about 10 kW, more preferably from about 2.5 kW to about 7.5 kW.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, and/or Ge), silica, silicon nitride, silicon oxide, silicon oxynitride, $Si_aO_bH_cC_dN_e$, (wherein a>0; b, c, d, e≥0), mask layer materials such as amorphous carbon, antireflective coatings, photoresist materials, tungsten, titanium nitride, tantalum nitride or combinations thereof, etch stop layer materials such as silicon nitride, polysilicon, crystalline silicon, silicon carbide, SiCN or combinations thereof, device channel materials such crystalline silicon, epitaxial silicon, doped silicon, $Si_aO_bH_cC_dN_e$, (wherein a>0; b, c, d, e≥0) or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

The following are exemplary embodiments of the substrates on which the disclosed iodine-containing etching compounds may be applied to etch.

In one embodiment, a substrate 100 may include a stack of multiple layers as shown in FIG. 1a. FIG. 1a is a cross-sectional side view of exemplary layers in a 3D NAND stack to produce a 3D NAND gate. In FIG. 1a, a stack of seven alternative SiO/SiN (i.e., 104a/104b) layers 104 is located on top of a silicon wafer 102 (i.e., ONON or TCAT technology). One of ordinary skill in the art will recognize that some technologies replace the SiN layers 104b with p-Si layers (e.g., SiO/p-Si or P-BICS technology). An amorphous carbon (a-C) mask layer 106 is located on the top of the seven SiO/SiN layers 104. The a-C mask layer 106 may contain C and H, as well as other elements, such as boron, nitrogen, etc., to improve etch resistance during SiO/SiN layer etch. An antireflective coating layer 108 is located on top of the a-C mask layer 106. A patterned photoresist layer 110 is located on top of the antireflective coating layer 108. Herein, a SiON layer (not shown) may be present between the antireflective coating layer 108 and the a-C mask layer 106 to transfer pattern in photoresist layer 110 to the a-C layer 106. One of ordinary skill in the art will recognize that the stack of layers in the substrate 100 in FIG. 1a is provided for exemplary purposes only and that the disclosed iodine-containing etching compounds may be used to etch other types of stacks of layers. Furthermore, one of ordinary skill in the art will recognize that the number alternating SiO/SiN or SiO/p-Si layers 104 in the stack of the substrate 100 may vary (i.e., may include more or less than the seven SiO/SiN (104a/104b) layers depicted).

Figure 1B:
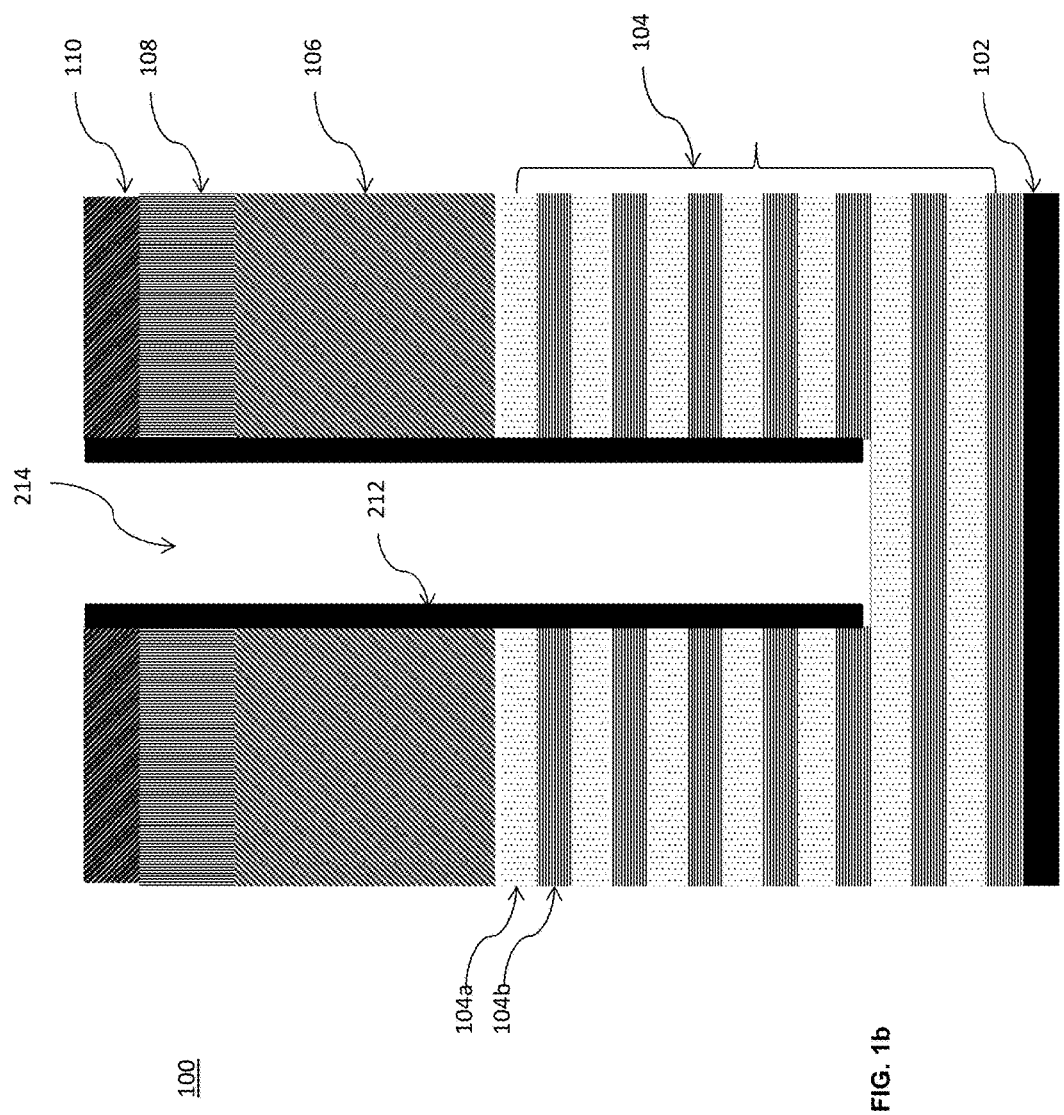
FIG. 1b is a cross-sectional side view of the exemplary layers in the 3D NAND stack showing polymer deposited on a sidewall during etching of the 3D NAND stack.

FIG. 1b is a cross-sectional side view of the exemplary layers in the 3D NAND stack of FIG. 1a showing polymer deposited on a sidewall during etching. The disclosed iodine-containing etching compounds may produce fragments during the plasma process that are suitable for both anisotropically etching the silicon-containing films 104 and depositing an I-containing polymer passivation layer 212 on sidewalls of a structure being etched as shown in FIG. 1b. The difference between FIG. 1b and FIG. 1a is in FIG. 1b via 214 is formed in substrate 100 by plasma etching using the disclosed iodine-containing etch compounds, which also deposit the polymer passivation layer 212 on the sidewalls of the via 214. The polymer passivation layer 212 also provides smoother sidewall, less bowing and less deformation at the bottom of the via 214. The polymer passivation layer 212 may however be easily removed or cleaned by dry or wet etch chemistries known in the art.

Figure 1C:
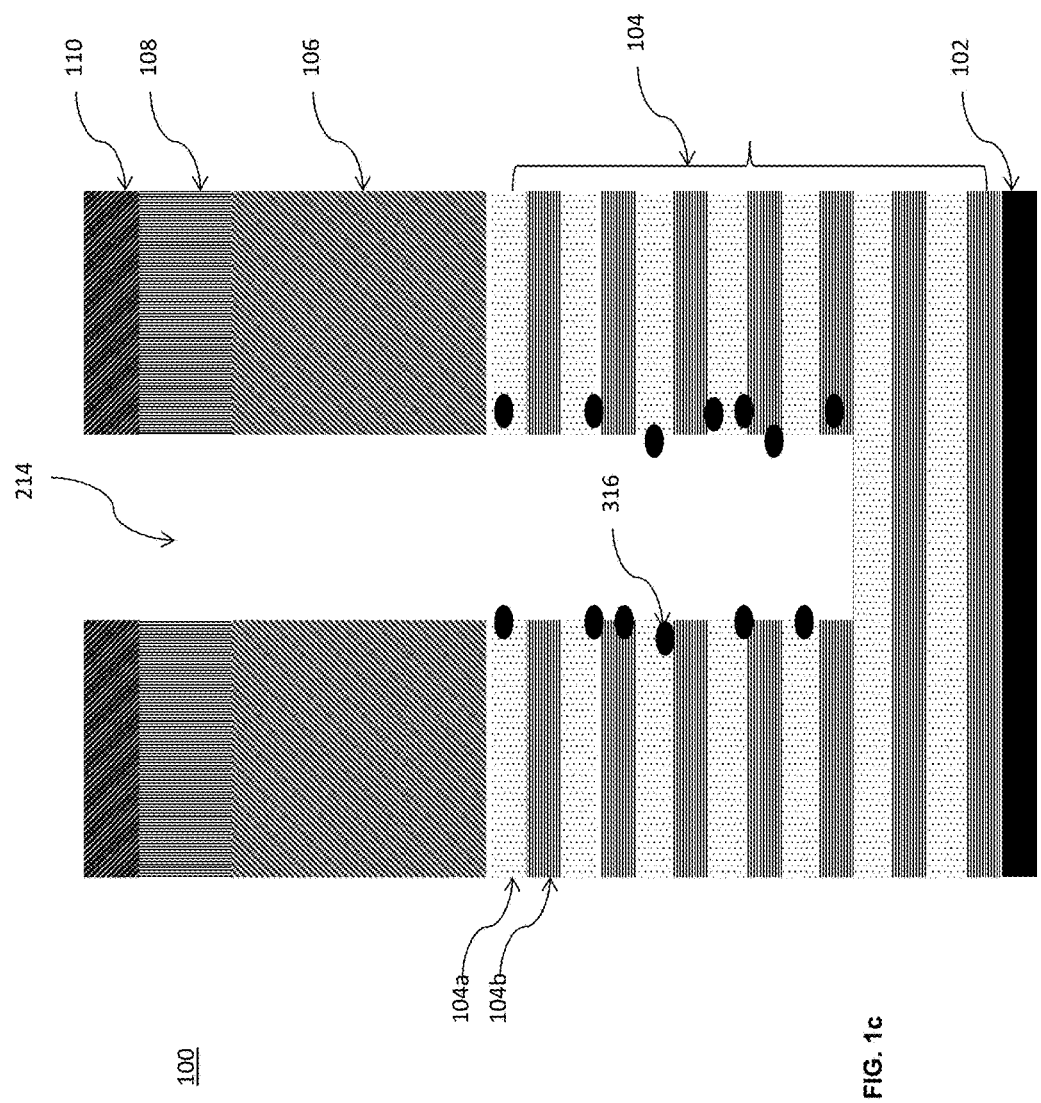
FIG. 1c is a cross-sectional side view of the exemplary layers in the 3D NAND stack showing particles generated during alternating SiO/SiN layer etching of a 3D NAND stack.

FIG. 1c is a cross-sectional side view of the exemplary layers in the 3D NAND stack of FIG. 1a showing particles 316 generated during alternating SiO/SiN layer etching in a 3D NAND stack. The particles 316 generated on the sidewalls of the alternative SiO/SiN (i.e., 104a/104b) layers 104 as shown in FIG. 1c may be minimized by using the disclosed iodine-containing etching compounds. The difference between FIG. 1c and FIG. 1b is in FIG. 1c the alternative SiO/SiN exposed sidewall has particles 316 generated during plasma etching. Applicants do not believe that the disclosed iodine-containing etching compounds will generate the particles 316 shown in FIG. 1c.

Figure 1D:
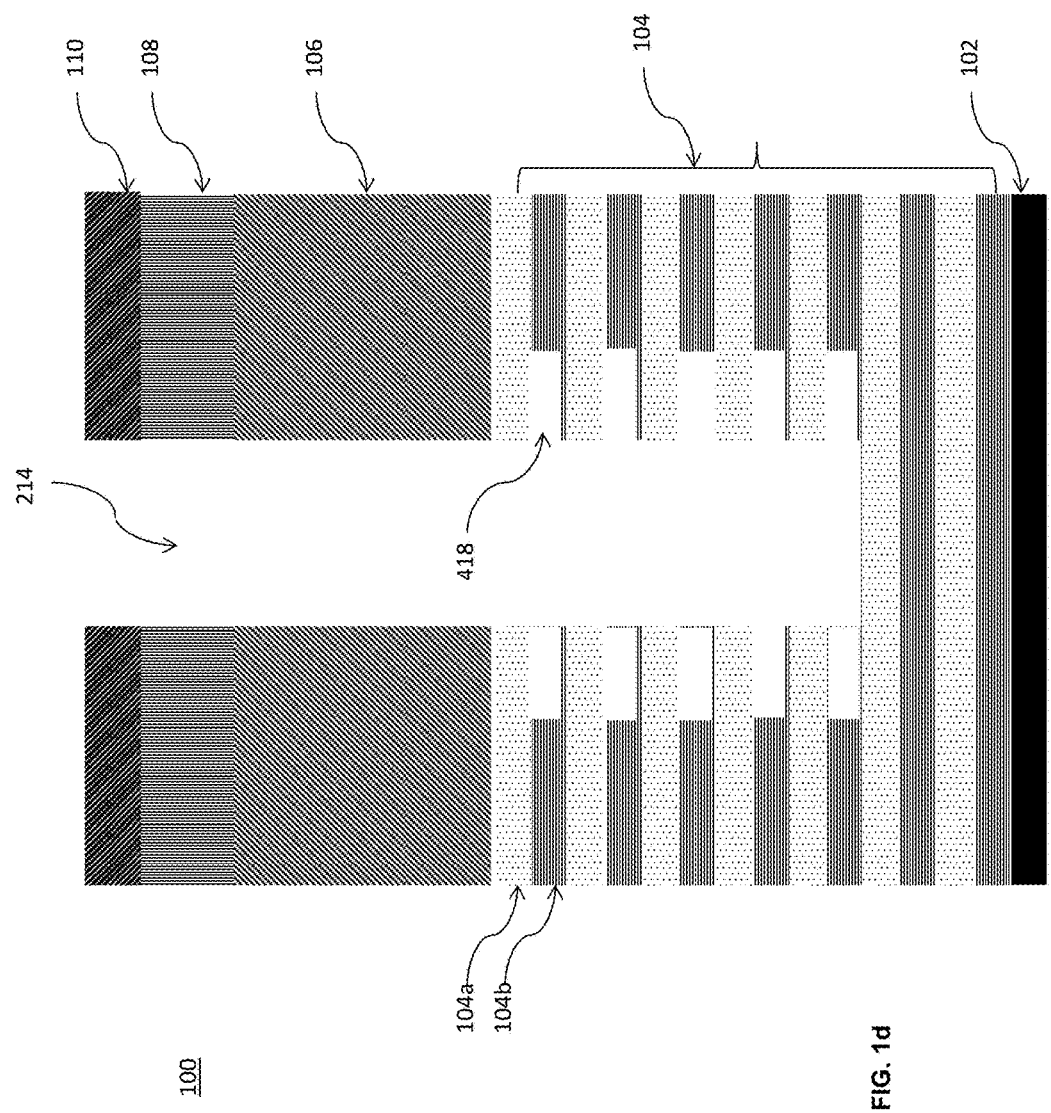
FIG. 1d is a cross-sectional side view of the exemplary layers in the 3D NAND stack showing selective etching of SiN exposed on the sidewall in the 3D NAND stack.

FIG. 1d is a cross-sectional side view of the exemplary layers in the 3D NAND stack of FIG. 1a showing selective isotropic etching of the SiN layers 104b exposed on the sidewall in the 3D NAND stack after the anisotropic etching process. The SiN exposed sidewall in stack 100 may be etched selectively as shown in FIG. 1d by using the disclosed iodine-containing etching compounds to selectively break the Si—N bonds in the SiN layers 104b over the Si—O bond in the SiO layers 104a forming a selective sidewall SiN etch 418 on the stack of SiO/SiN layers 104 in the via 214. The difference between FIG. 1d and FIG. 1b is in FIG. 1d SiN exposed on the alternative SiO/SiN sidewall is selectively etched by the disclosed iodine-containing etching compounds forming the selective sidewall SiN etch 418. Typically, the selective sidewall SiN etch 418 is performed by wet etching using mixtures with phosphoric acid. Replacing wet etch process with dry plasma etch processes is known to greatly improve the economics of semiconductor device fabrication process since wet etching requires moving the substrate to different wet etching equipments. With the disclosed methods, all etching, including the selective sidewall SiN etch of FIG. 1d, may be performed in one piece of etching equipment, which may reduce the cost of the semiconductor fabrication.

Figure 2:
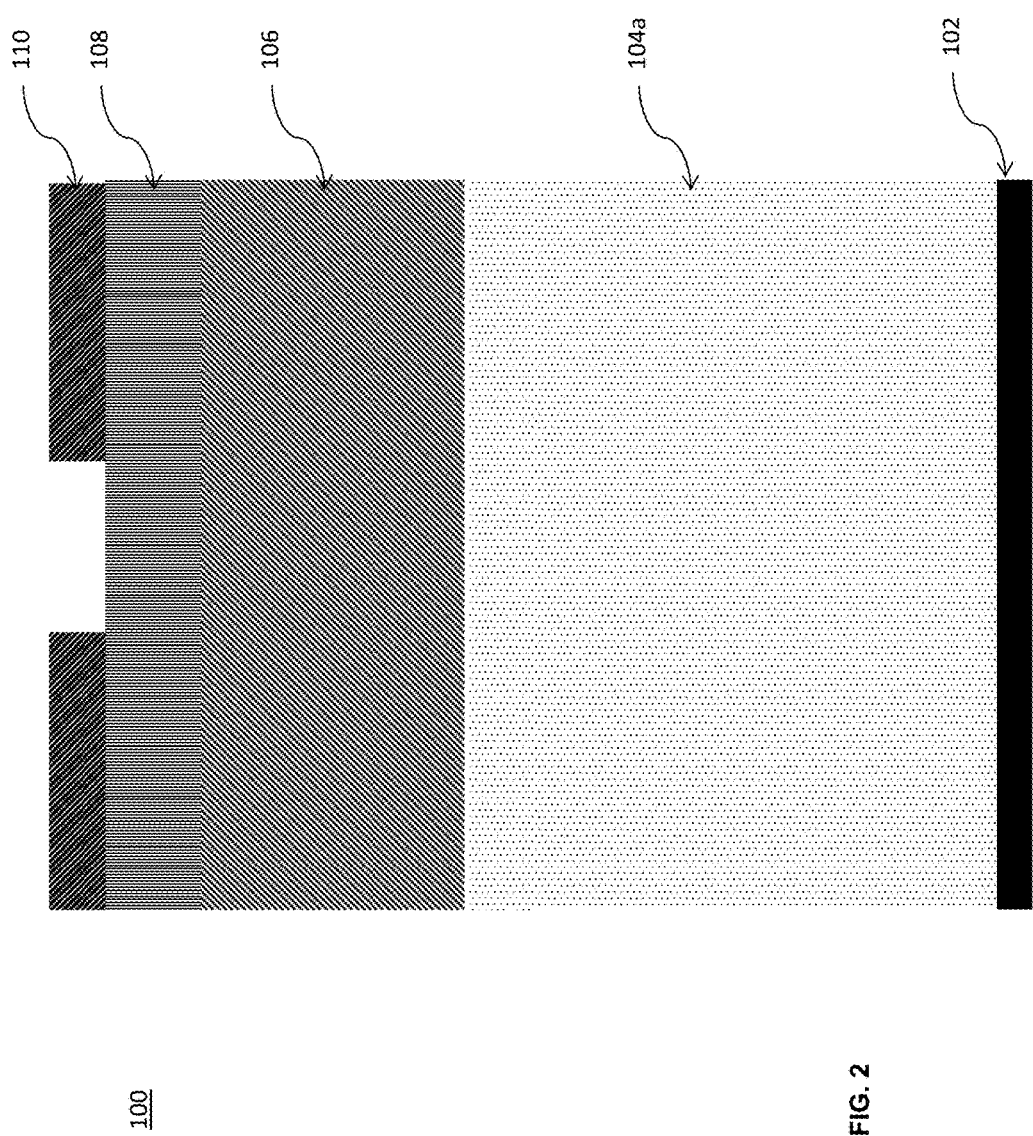
FIG. 2 is a cross-sectional side view of exemplary layers of a DRAM stack.

In alternative embodiment, substrate 100 may include a stack of multiple layers thereon as shown in FIG. 2. FIG. 2 is a cross-sectional side view of exemplary layers in a DRAM stack to produce a DRAM memory. In FIG. 2, a stack of four layers is located on top of a silicon wafer 102. An a-C mask layer 106 is located on top of a large SiO layer 104a. An antireflective coating layer 108 is located on top of the a-C mask 106. A pattern photoresist layer 110 is located on top of the antireflective coating 108. A SiON layer (not shown) may be present between the antireflective coating layer 108 and the a-C mask layer 106 to transfer pattern in photoresist layer 110 to the a-C layer 106. One of ordinary skill in the art will recognize that the stack of layers in FIG. 2 is provided for exemplary purposes only and that the disclosed iodine-containing etching compounds may be used to etch other stacks of layers, for example, for a stack where the a-C mask layer 106 is replaced with a TiN layer. Furthermore, one of ordinary skill in the art will recognize that the number of layers in the stack may vary (i.e., may include more or less than the layers depicted).

Figure 3A:
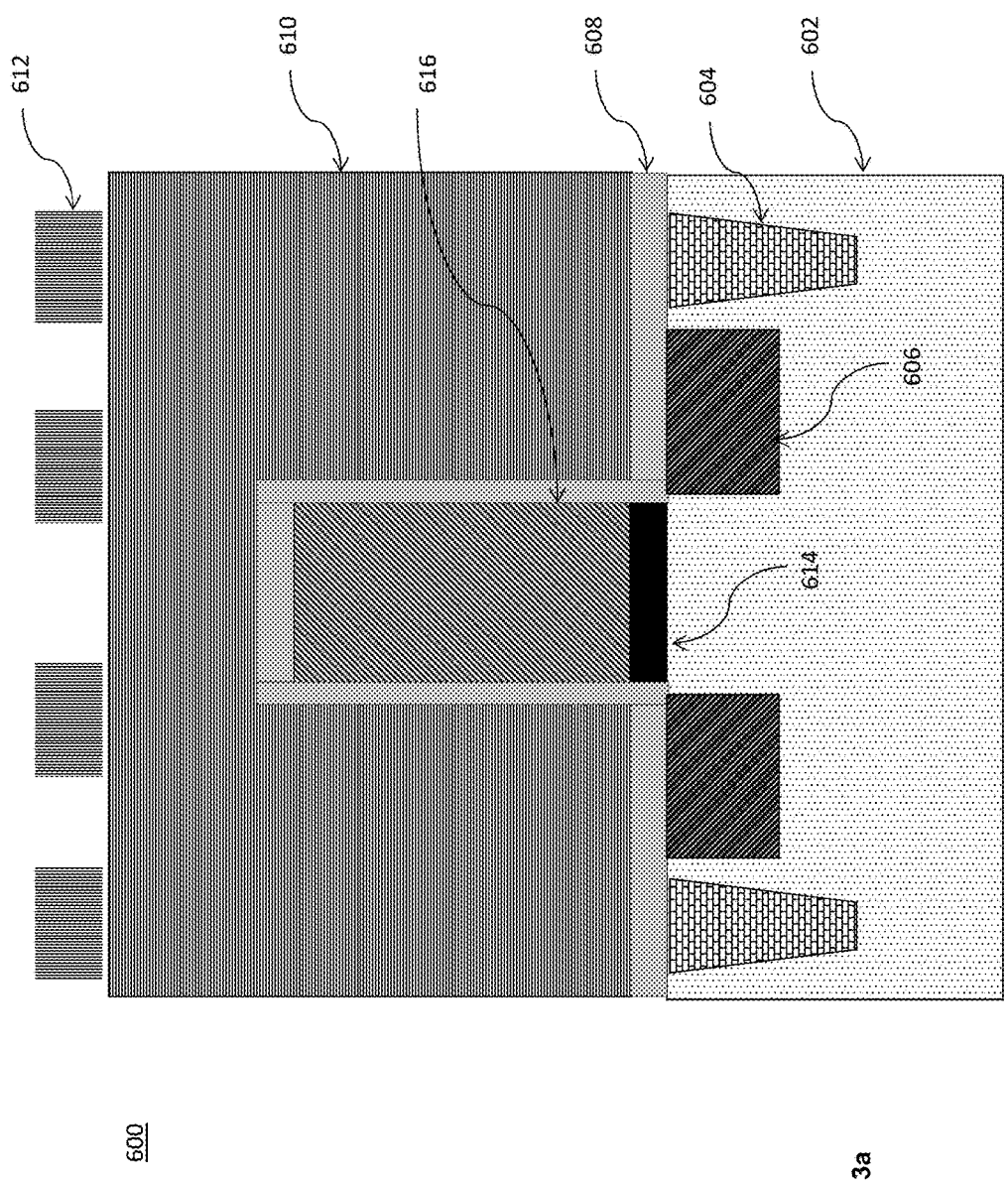
FIG. 3a is a cross-sectional side view of exemplary layers showing photoresist pattern over SiO insulation layer surrounding typical transistor device region to produce a transistor structure.

FIG. 3a is a cross-sectional side view of exemplary layers showing photoresist pattern over SiO insulation layer surrounding a typical transistor device region to produce a transistor structure. Substrate 600 may include a stack of four layers surrounding a transistor gate electrode region supported on the Silicon wafer 602 as shown in FIG. 3a. The transistor region shown in FIG. 3a includes two doped silicon regions 606 acting as source and drain. Transistor gate dielectric 614 is present underneath gate electrode 616. The whole transistor, i.e., transistor gate dielectric 614 and gate electrode 616, is surrounded by a thin SiN layer 608 which may later act as etch stop layer during contact etch. Each transistor device region 616/606 is separated by SiO isolation regions 604 in the silicon wafer 602 to minimize electrical interference. One of ordinary skill in the art will recognize that layer 602 may be located on top of a silicon oxide layer of the Silicon on Insulator (SOI) wafer. Another SiO layer 610 is deposited on the transistor and used to insulate any metal contact to the transistor device regions 606. Photoresist mask 612 is used to pattern the SiO layer 610. Etching is performed using the disclosed iodine-containing etching compounds in plasma environment. The photoresist mask 612 serves as a template to etch the SiO layer 610 and etching is stopped on the SiN layer 608 as shown in FIG. 3b.

Figure 3B:
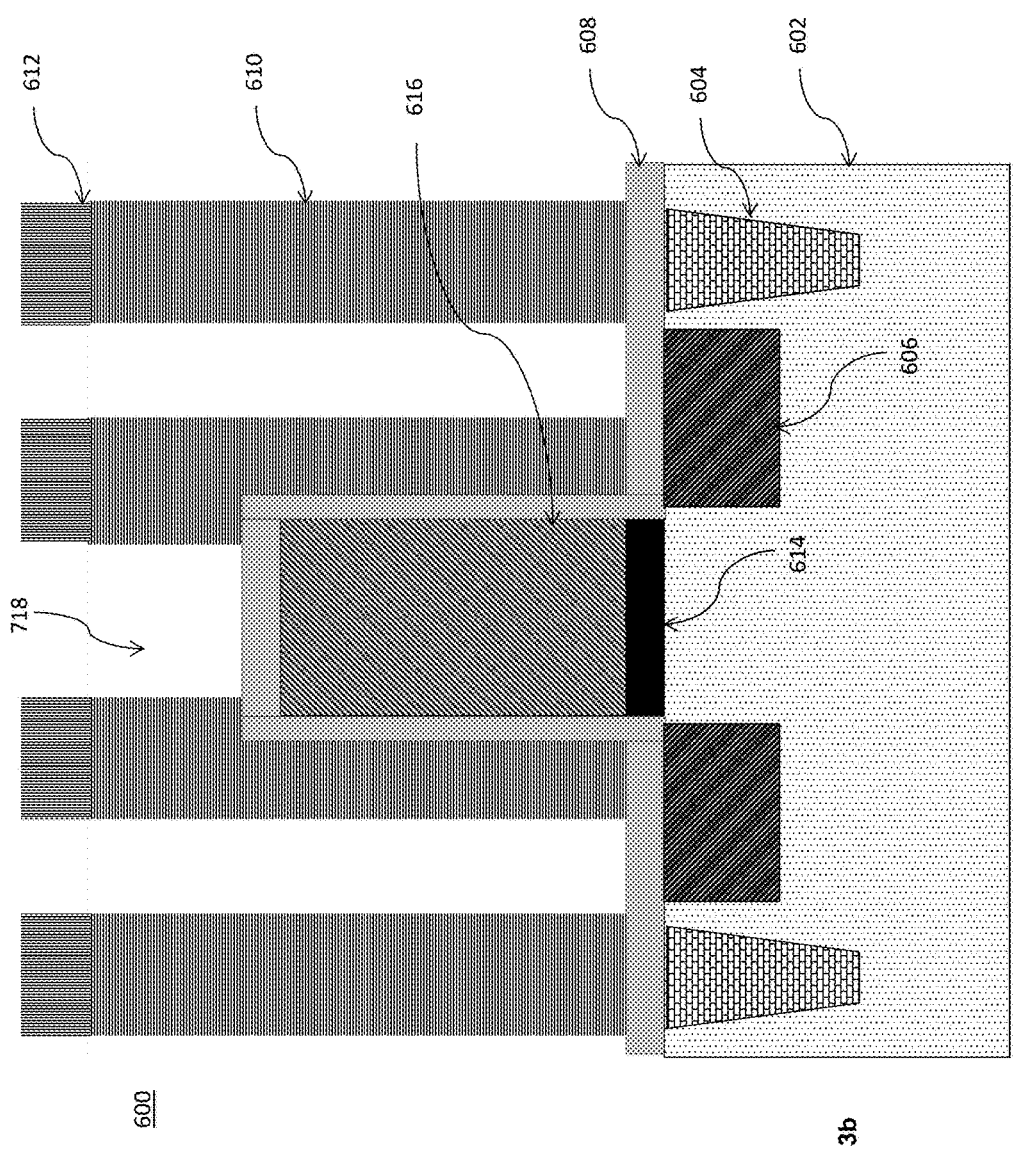
FIG. 3b is a cross-sectional side view of the exemplary layers of FIG. 3a after etching the SiO insulation layer.

FIG. 3b is a cross-sectional side view of the exemplary layers of FIG. 3a after etching the SiO insulation layer. The difference between FIG. 3b and FIG. 3a is in FIG. 3b vias 718 are formed in the SiO layer 610 through etching by the disclosed iodine-containing etching compounds. The SiO layer 610 may be etched with photoresist layer 612 as a mask layer. The mask layer may be any suitable photoresist mask materials, such as TiN, a-C and so on. The etching may be stopped at the underlying SiN layer 608.

The disclosed iodine-containing etching compounds may also be used to etch the SiN layer 608 with different plasma conditions and different mixtures. One of ordinary skill in the art will recognize that the stack and geometry of layers in FIG. 3a and FIG. 3b is provided for exemplary purposes only and that the disclosed iodine-containing etching compounds may be used to etch other types of stacks of layers. Furthermore, one of ordinary skill in the art will recognize that the number of layers in the stack may vary (i.e., may include more or less than the four layers depicted).

The vapor of the disclosed iodine-containing etching compounds is introduced into the reaction chamber containing the substrate and silicon-containing films. The vapor may be introduced to the chamber at a flow rate ranging from approximately 0.1 sccm to approximately 1 slm. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate may vary from tool to tool.

The disclosed iodine-containing etching compounds may be supplied either in neat form or in a blend with an inert gas, such as $N_2$, Ar, He, Xe, etc., or solvent. The disclosed iodine-containing etching compounds may be present in varying concentrations in the blend. For liquid iodine-containing etching compounds, the vapor form of the iodine-containing etching compounds may be produced by vaporizing the neat or blended iodine-containing etching compound solution through a conventional vaporization step such as direct vaporization or by bubbling. The neat or blended iodine-containing etching compounds may be fed in liquid state to a vaporizer where it is vaporized before it is introduced into the reactor.

Alternatively, the neat or blended iodine-containing etching compounds may be vaporized by passing a carrier gas into a container containing the disclosed iodine-containing etching compounds or by bubbling the carrier gas into the disclosed iodine-containing etching compounds. The carrier gas may include, but is not limited to, Ar, He, $N_2$, and mixtures thereof. Bubbling with a carrier gas may also remove any dissolved oxygen present in the neat or blended iodine-containing etching compound solution. The carrier gas and disclosed iodine-containing etching compounds are then introduced into the reactor as a vapor.

If necessary, the container containing the disclosed iodine-containing etching compounds may be heated to a temperature that permits the iodine-containing etching compounds to be in liquid phase and to have a sufficient vapor pressure for delivery into an etching tool. The container may be maintained at temperatures in the range of, for example, approximately 00° C. to approximately 150° C., preferably from approximately 25° C. to approximately 100° C., more preferably from approximately 25° C. to approximately 50° C. More preferably, the container is maintained at room temperature (approximately 25° C.) in order to avoid heating lines to the etch tool. Those skilled in the art recognize that the temperature of the container may be adjusted in a known manner to control the amount of iodine-containing etching compound vaporized.

Additionally, the iodine-containing etching compounds are delivered in purity ranging from 95% to 99.999% by volume and may be purified with known standard purification techniques for removal of CO, $CO_2$, $N_2$, $H_2O$, HF, $H_2S$, $SO_2$, halides, and other hydrocarbons or hydrohalocarbons.

An inert gas is also introduced into the reaction chamber in order to sustain the plasma. The inert gas may be He, Ar, Xe, Kr, Ne, $N_2$ or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The vapor of the disclosed etching gas and inert gas are activated by plasma to produce an activated etching gas. The plasma decomposes the etching gas into radical form (i.e., the activated etching gas). The plasma may be generated by applying RF or DC power. The plasma may be generated with a RF power ranging from about 25 W to about 10,000 W. The plasma may be generated remotely or within the reactor itself. The plasma may be generated in dual CCP or ICP mode with RF applied at both electrodes. RF frequency of plasma may range from 200 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/ion measurement tools may measure the activated etching gas from the chamber exhaust to determine the types and numbers of species produced. If necessary, the flow rate of the etching gas and/or the inert gas may be adjusted to increase or decrease the number of radical species produced.

The disclosed etching gases may be mixed with other gases either prior to introduction into the reaction chamber or inside the reaction chamber. Preferably, the gases may be mixed prior to introduction to the chamber in order to provide a uniform concentration of the entering gas.

In another alternative, the vapor of the iodine-containing etching compound may be introduced into the chamber independently of the other gases, such as when two or more of the gases react or are easier to deliver independently.

In another alternative, the etching gas and the inert gas are the only two gases that are used during the etching process.

Exemplary other gases include, without limitation, oxidizers such as $O_2$, $O_3$, CO, $CO_2$, NO, $N_2O$, $NO_2$, and combinations thereof. The disclosed etching gases and the oxidizer may be mixed together prior to introduction into the reaction chamber.

Alternatively, the oxidizer may be introduced continuously into the chamber and the etching gas introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

Other exemplary gases with which the disclosed iodine-containing etching compounds may be used include additional etching gases, such as $cC_4F_8$, $C_4F_8$, $C_4F_6$, $CF_4$, $CH_3F$, $CF_3H$, $CH_2F_2$, COS, $CS_2$, $CF_3I$, $C_2F_3I$, $C_2F_5I$, $SO_2$, trans-1,1,1,4,4,4-hexafluoro-2-butene (trans-$C_4H_2F_6$), cis-1,1,1,4, 4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$). For example, approximately 1% v/v to approximately 25% v/v of the disclosed iodine-containing etching compound may be used with a balance of $C_4F_6$ or $cC_4F_8$. As shown in the examples that follow, the combination of the disclosed iodine-containing etching compounds with conventional etch gases may result in increased etch rates while maintaining the higher selectivity between the substrate and layer to be etched associated with the disclosed iodine-containing etching compounds.

The vapor of the disclosed iodine-containing etching compounds and the etching gas may be mixed prior to introduction to the reaction chamber. The additional etching gas may comprise between approximately 0.01% v/v to approximately 99.99% v/v of the mixture introduced into the chamber.

In one non-limiting exemplary plasma etch process, the vapor of 1,1,3,3-tetrafluoro-3-iodo-1-propene (CAS No. 674-03-3) is introduced into a 200 mm Dual CCP plasma etch tool using a controlled gas flow device. The controlled gas flow device may be a mass flow controller or a bubbler design with inert gas flow to deliver the vapor of the desired molecule. In case of high boiling point molecules, a special low pressure drop mass flow controller from Brooks Automation (No. GF120XSD), MKS Instruments, etc., may be used. The pressure of the reaction chamber is set at approximately 30 mTorr. No gas source heating may be necessary if the vapor pressure is sufficient. The distance between the two CCP electrodes is kept at 1.35 cm and the top electrode RF power is fixed at 750 W. The bottom electrode RF power is varied to analyze the performance of the molecule. The reaction chamber contains a substrate having silicon-containing films thereon, similar to those shown in FIG. 1a. The antireflective coating layer 108 is patterned/etched by a fluorocarbon (e.g., $CF_4$ and $CH_2F_2$) and oxygen-containing gas (e.g., $O_2$). The amorphous carbon mask layer is patterned/etched by an oxygen-containing gas. The SiO and SiN layers 104 are patterned by the plasma of the disclosed iodine-containing etching compounds (e.g., 1,1,3,3-tetrafluoro-3-iodo-1-propene) and Argon. Argon is independently introduced into the chamber at a 250 sccm flow rate. 1,1,3,3-tetrafluoro-3-iodo-1-propene is independently introduced into the chamber at 15 sccm. $O_2$ is independently introduced into the chamber and varied from 0 sccm to 20 sccm to determine optimum etching conditions. An aperture having an aspect ratio equal to or greater than 30:1 is produced, which may be used as a channel hole in vertical NAND. Similar example may be used for other stack layers as shown in FIGS. 2 and 3a.

In another non-limiting exemplary plasma etch process, 1,2-difluoro-1-iodo-ethene is introduced into a 200 mm Dual CCP plasma etch tool using a controlled gas flow device. The controlled gas flow device may be a mass flow controller. In case of high boiling point molecules, a special low pressure drop mass flow controller from BrooksAutomation (No. GF120XSD), MKS Instruments, etc., may be used. The pressure of the reaction chamber is set at approximately 30 mTorr. No gas source heating may be necessary if the vapor pressure is sufficient. The distance between the two CCP electrodes is kept at 1.35 cm and the top electrode RF power is fixed at 750 W. The bottom electrode RF power is varied to analyze the performance of 1,2-difluoro-1-iodo-ethene. The reaction chamber contains a substrate 100 having a thick SiO layer 104a thereon, similar to the layer shown in FIG. 2. Prior to this process, the antireflective coating layer 108 is removed by a fluorocarbon (e.g., $CF_4$) and oxygen-containing gas (e.g., $O_2$) and the a-C mask layer 106 is removed by an oxygen-containing gas. Argon is independently introduced into the chamber at a 250 sccm flow rate. 1,2-difluoro-1-iodo-ethene is independently introduced into the chamber at 15 sccm. $O_2$ is independently introduced into the chamber at 0-20 sccm to determine optimum etching conditions. An aperture having an aspect ratio equal to or greater than 10:1 is produced, which may be used as a contact hole in DRAM. Similar examples may be used for other stack layers as shown in FIGS. 1a and 3a.

The silicon-containing films and the activated iodine-containing etching gas react to form volatile by-products that are removed from the reaction chamber. The a-C mask, antireflective coating, and photoresist layer are less reactive with the activated etching gas. Thus, the activated etching gas selectively reacts with the silicon-containing films to form volatile by-products.

The temperature and the pressure within the reaction chamber are held at conditions suitable for the silicon-containing film to react with the activated etching gas. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, and more preferably between approximately 10 mTorr and approximately 100 mTorr, as required by the etching parameters. Likewise, the substrate temperature in the chamber may range between about approximately −196° C. to approximately 500° C., preferably between approximately −120° C. to approximately 300° C., more preferably between approximately −100° C. to approximately 50° C.; and more preferably between approximately −10° C. to approximately 40° C. Chamber wall temperatures may range from approximately −196° C. to approximately 300° C. depending on the process requirements.

The reactions between the silicon-containing film and the activated etching gas result in anisotropic removal of the silicon-containing films from the substrate. Atoms of nitrogen, oxygen, and/or carbon may also be present in the silicon-containing film. The removal is due to a physical sputtering of silicon-containing film from plasma ions (accelerated by the plasma) and/or by chemical reaction of plasma species to convert Si to volatile species, such as $SiF_x$, wherein x ranges from 1-4.

The plasma activated vapor of the disclosed iodine-containing etching compounds preferably exhibits high selectivity toward the mask and etches through the alternating layers of SiO and SiN resulting in a vertical etch profile with no bowing or roughness, which is important for 3D NAND applications. Additionally, plasma activated vapor deposits polymer on sidewall to minimize feature profile deformation. For other applications, such as DRAM and 2D NAND, for example, the plasma activated etching gas under different process conditions may selectively etch SiO from SiN. The plasma activated etching gas may selectively etch SiO and/or SiN from mask layers, such as a-C, photoresist, p-Si, or silicon carbide; or from metal contact layers, such as Cu; or from channel regions consisting of SiGe or polysilicon regions.

The disclosed etch processes using the disclosed iodine-containing etching compounds as the etching gases produce channel holes, gate trenches, staircase contacts, capacitor holes, contact holes, etc., in the silicon-containing films. The resulting aperture may have an aspect ratio ranging from approximately 10:1 to approximately 200:1 and a diameter ranging from approximately 5 nm to approximately 50 nm. For example, one of ordinary skill in the art will recognize that a channel hole etch produces apertures in the silicon-containing films having an aspect ratio greater than 60:1.

Typical materials that need to be etched may be SiO. A process of etching SiO may be relevant to etching trenches in Borophosphosilicateglass (BPSG), Tetraethylorthosilicate (TEOS), or low deposition rate TEOS (LDTEOS). An etch stop layer may be silicon nitride or silicon oxygen nitride (SiON) or poly silicon. A mask material used may be a-C, p-Si, or photo resist materials. Herein, the disclosed iodine-containing etching compounds are applied to etch SiO, SiN, p-Si and/or a-C substrate films.

EXAMPLES

The following non-limiting examples are provided to further illustrate embodiments of the invention. However, the examples are not intended to be all inclusive and are not intended to limit the scope of the inventions described herein.

Example 1

A mass spectrometer may be used to study electron impact ionizations of several of the disclosed iodine-containing etching gases. For this test, the etch gases are allowed to flow through the mass spectrometer chamber and a Quadrupole mass spectrometer (Hiden Analytical Inc.) detector is used to study the fragments from the etch gas as a function of electron energy. In the figures that follow, the x-axis represents electron energy from 0-100 eV and y-axis represents the partial pressure in Torr of the fragment species.

Figure 4:
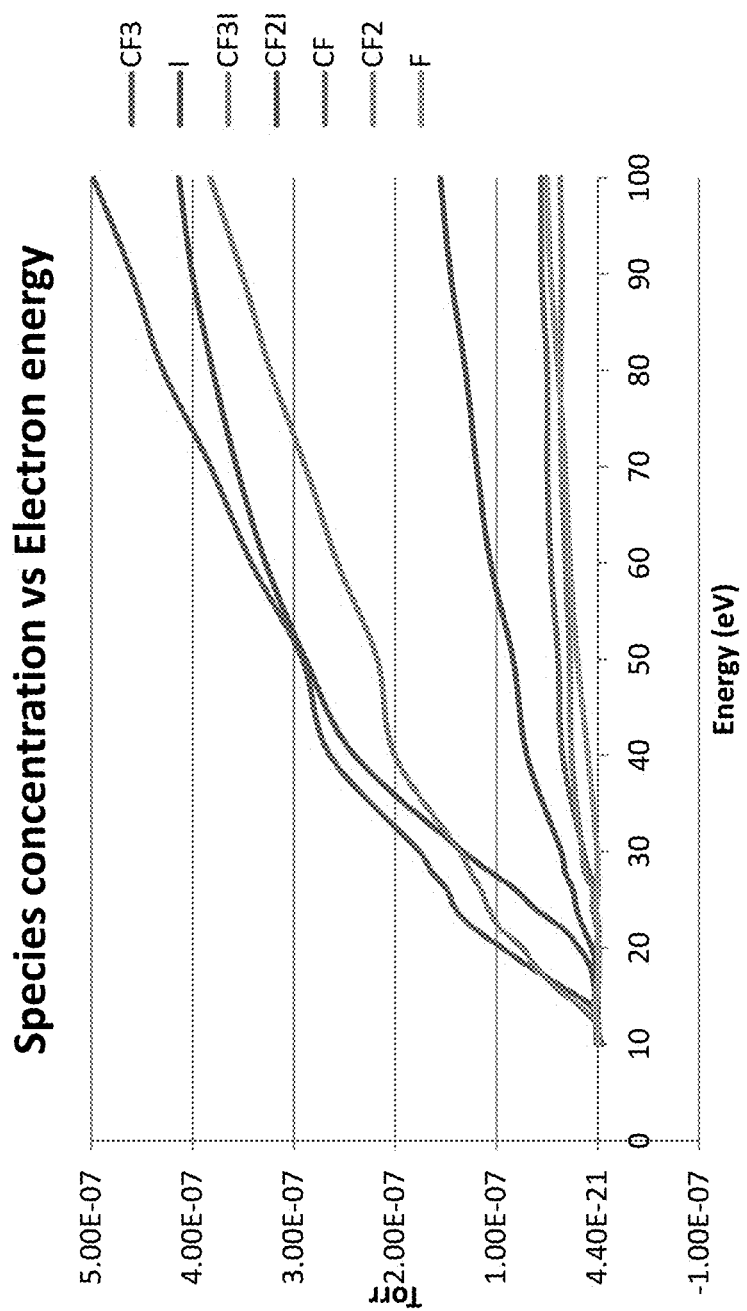
FIG. 4 is a graph demonstrating the electron impact ionization energy (eV) versus species concentration (Torr) of $CF_3I$.

FIG. 4 is a graph demonstrating the electron impact ionization energy (eV) versus species concentration (Torr) of $CF_3I$ (CAS No. 2314-97-8). The dominant fragments or ionized product produced at between 10 and 20 eV are $CF_3$, I, and $CF_3I$.

Figure 5:
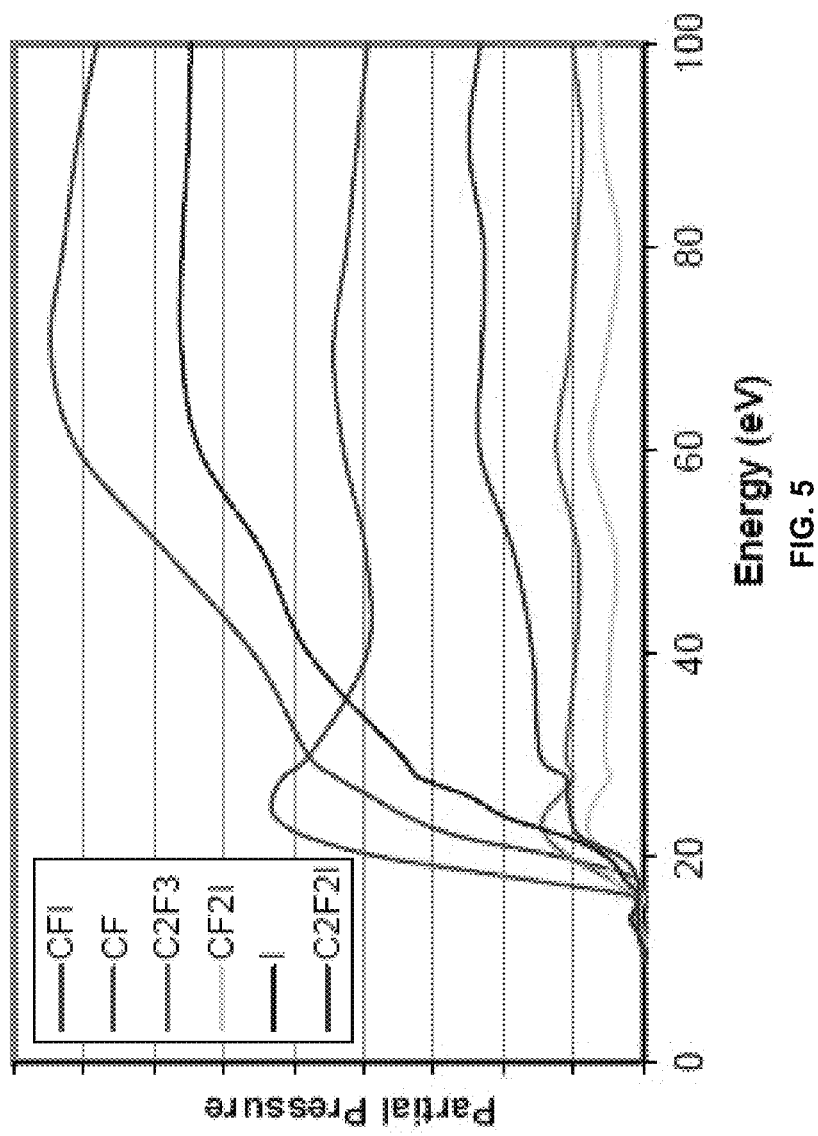
FIG. 5 is a graph demonstrating the electron impact ionization energy (eV) versus species concentration (Torr) of $C_2F_3I$.

FIG. 5 is a graph demonstrating the electron impact ionization energy (eV) versus species concentration (Torr) of $C_2F_3I$ (CAS No. 359-37-5). The dominant fragments produced at between 10 and 20 eV are CFI, CF, and I.

Figure 6:
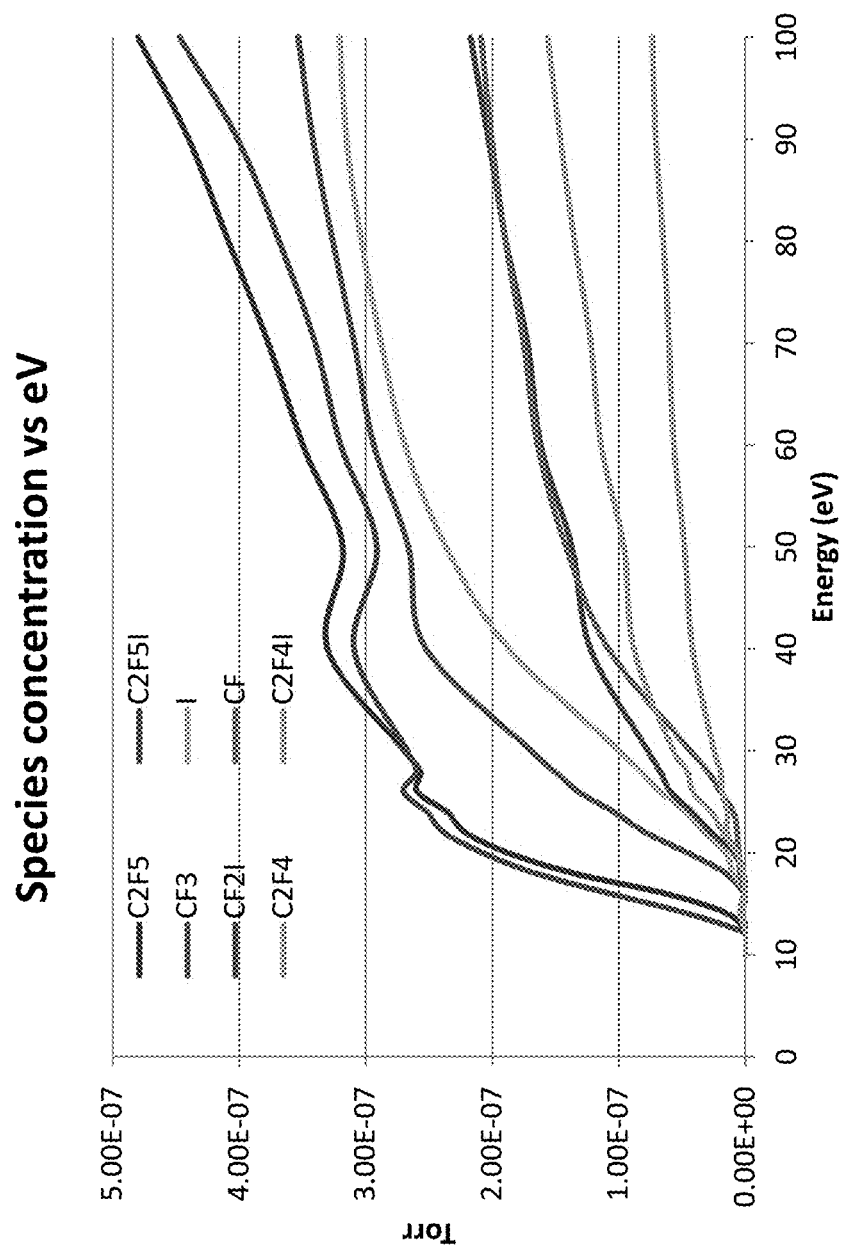
FIG. 6 is a graph demonstrating the electron impact ionization energy (eV) versus species concentration (Torr) of $C_2F_5I$.

FIG. 6 is a graph demonstrating the electron impact ionization energy (eV) versus species concentration (Torr) of $C_2F_5I$ (CAS No. 354-64-3). The dominant fragments or ionized product produced at between 10 and 20 eV are $C_2F_5$, $C_2F_5I$, $CF_3$, and I.

Figure 7:
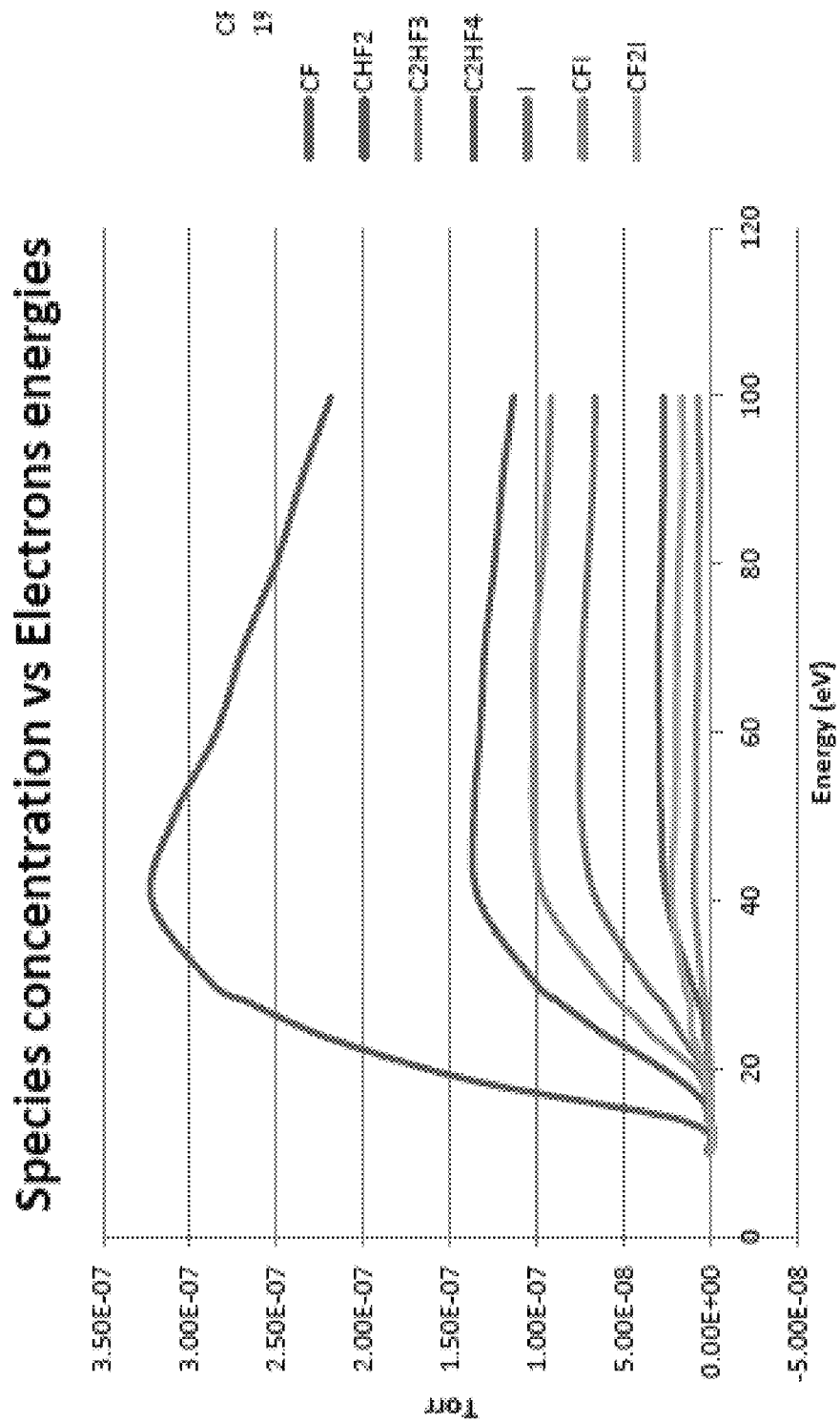
FIG. 7 is a graph demonstrating the electron impact ionization energy (eV) versus species concentration (Torr) of $C_2HF_4I$.

FIG. 7 is a graph demonstrating the electron impact ionization energy (eV) versus species concentration (Torr) of $C_2HF_4I$ (CAS No. 354-41-6). The dominant fragments produced at between 10 and 20 eV are $C_2HF_4$, $CHF_2$, $C_2HF_3$, and I.

Figure 8:
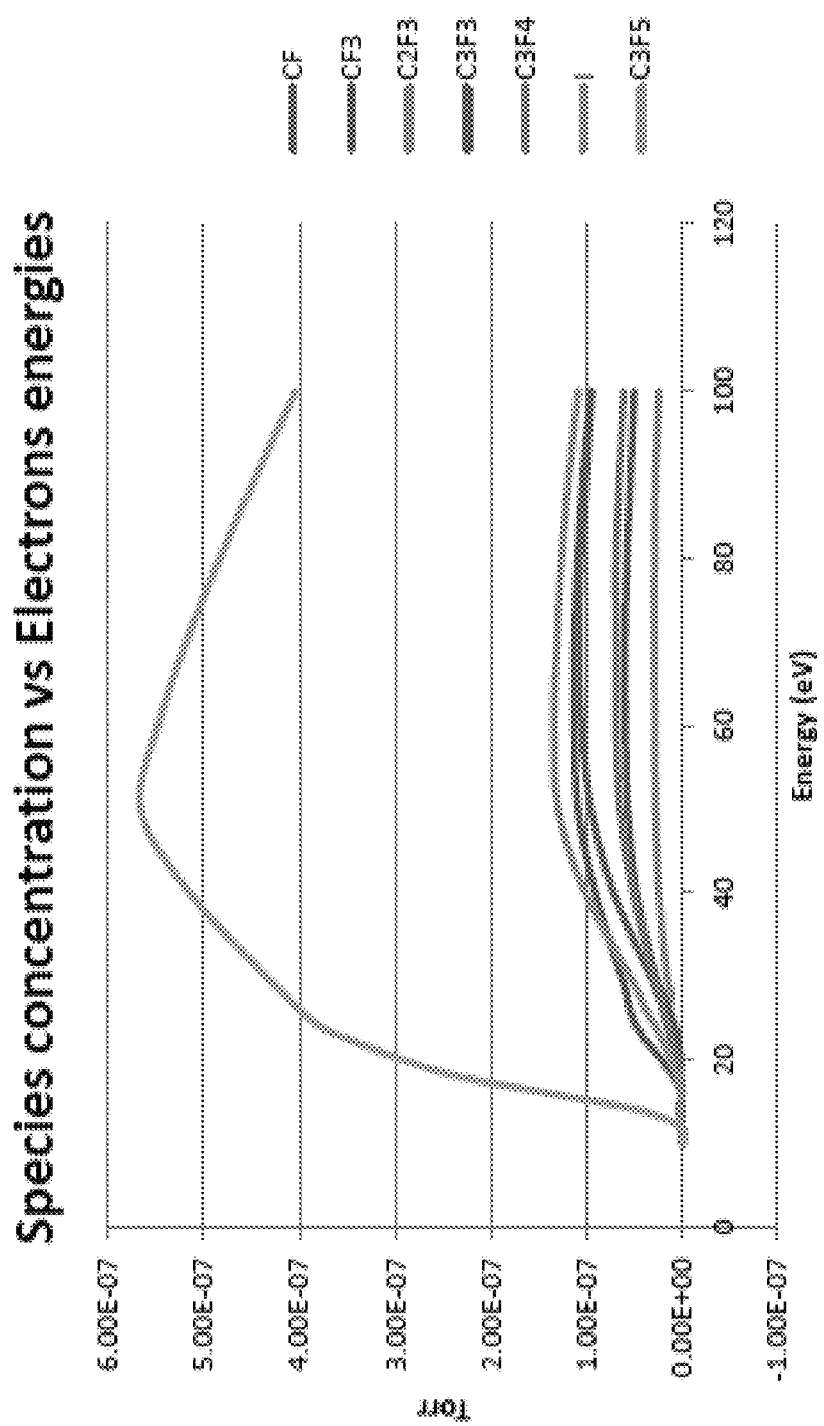
FIG. 8 is a graph demonstrating the electron impact ionization energy (eV) versus species concentration (Torr) of $C_3F_5I$.

FIG. 8 is a graph demonstrating the electron impact ionization energy (eV) versus species concentration (Torr) of $C_3F_5I$ (CAS No. 431-65-2). The dominant fragments produced at between 10 and 20 eV are $C_3F_5$, $CF_3$, and I.

Figure 9:
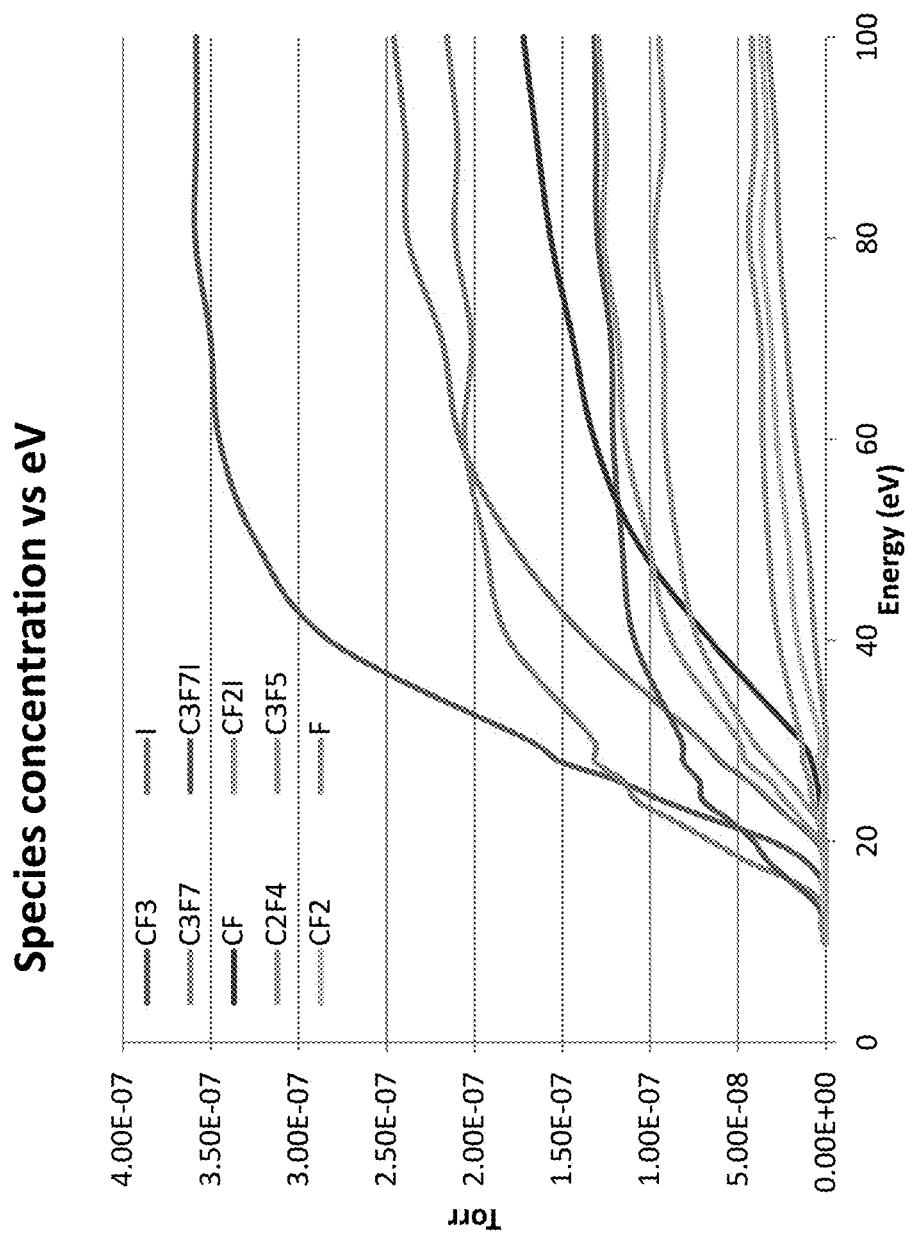
FIG. 9 is a graph demonstrating the electron impact ionization energy (eV) versus species concentration (Torr) of $C_3F_7I$.

FIG. 9 is a graph demonstrating the electron impact ionization energy (eV) versus species concentration (Torr) of $C_3F_7I$ (CAS No. 754-34-7). The dominant fragments produced at between 10 and 20 eV are $CF_3$, $O_3F_7$, and I.

Comparative Example

Some non-iodine containing analogs of the disclosed iodine-containing etching compounds were injected into a QMS and data collected from 10-100 eV.

Figure 10:
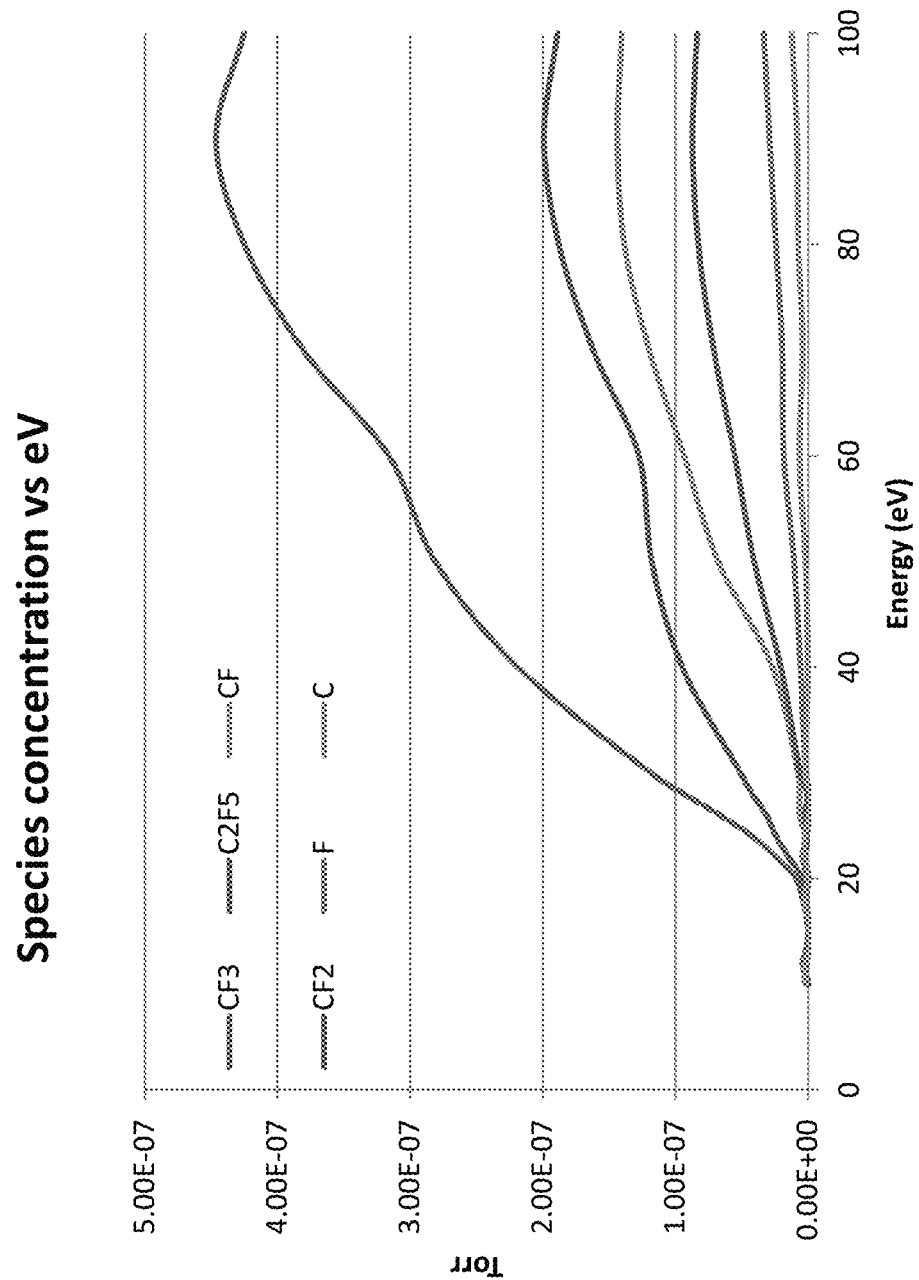
FIG. 10 is a graph demonstrating the electron impact ionization energy (eV) versus species concentration (Torr) of $C_2F_6$.

FIG. 10 is a graph demonstrating the electron impact ionization energy (eV) versus species concentration (Torr) of $C_2F_6$ (CAS No. 76-16-4). The dominant fragments produced at between 10 and 20 eV are $CF_3$, $C_3F_7$, and I.

Figure 11:
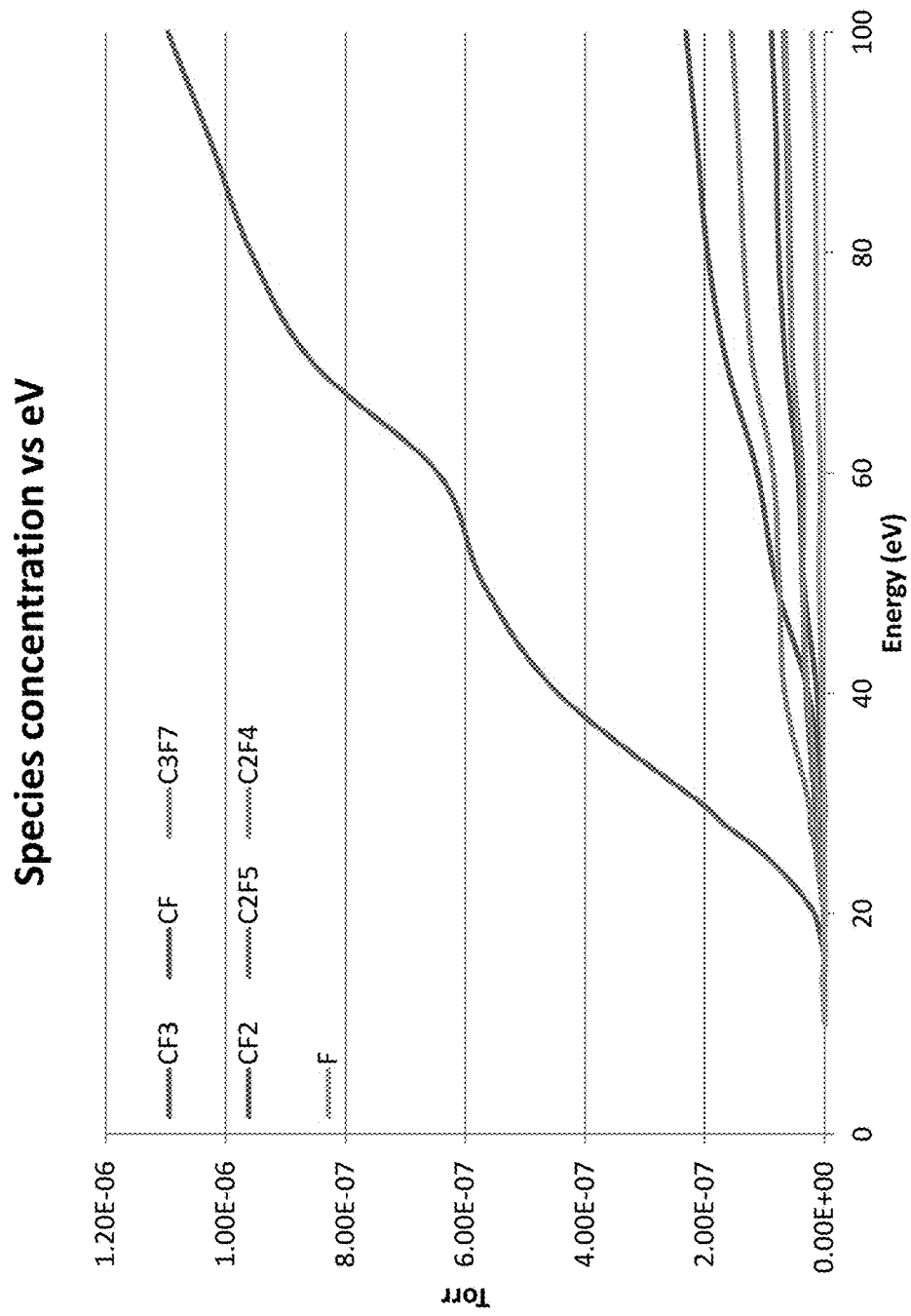
FIG. 11 is a graph demonstrating the electron impact ionization energy (eV) versus species concentration (Torr) of $C_3F_8$.

FIG. 11 is a graph demonstrating the electron impact ionization energy (eV) versus species concentration (Torr) of $C_3F_8$ (CAS No. 76-19-7).

The dominant $CF_3$ species of FIGS. 10-11 is activated at a higher ionization energy when compared to the ionization energies needed to produce the dominant species of the analogous C2 and C3 compounds of FIGS. 5-9. Applicants believe that the ability to dissociate the disclosed iodine-containing etching compounds at lower energies provides increased dissociation of the etch species as well as lower required plasma energy for the etching process.

Example 2

In this example, etching experiments were performed on four 1×1 $cm^2$ coupons having four different substrate materials including SiO, SiN, p-Si, and a-C using a Lam 4520XLe 200 mm Dual CCP etcher. Deposition and/or etch rates are measured using an ellipsometer and/or scanning electron microscope (SEM) by measuring the change in etch thickness as a function of etching time. The coupons are placed on 200 mm diameter carrier wafer and held in contact by using double sided carbon tape obtained from 2spi manufacturer. Alternatively, thermal paste may have been used to stick coupons on carrier wafer.

Deposition tests are performed on 1×1 $cm^2$ Si coupon at 30 mTorr, and source power of 750 W (27 MHz), with no bias power at the substrate. The process feed mixture contains 250 sccm of Ar and 15 sccm of etch gas. The deposition test sample is then sent for X-ray Photoelectron spectrometry (XPS) analysis to study the type of polymerizing film formed on the substrate.

Etching tests are also performed at 30 mTorr, source power of 750 W (27 MHz), and bias power of 1500 W (2 MHz). The feed mixture contains 250 sccm of Ar, 15 sccm of etch gas, while $O_2$ is varied in the range 0 to 15 sccm.

Figure 12:
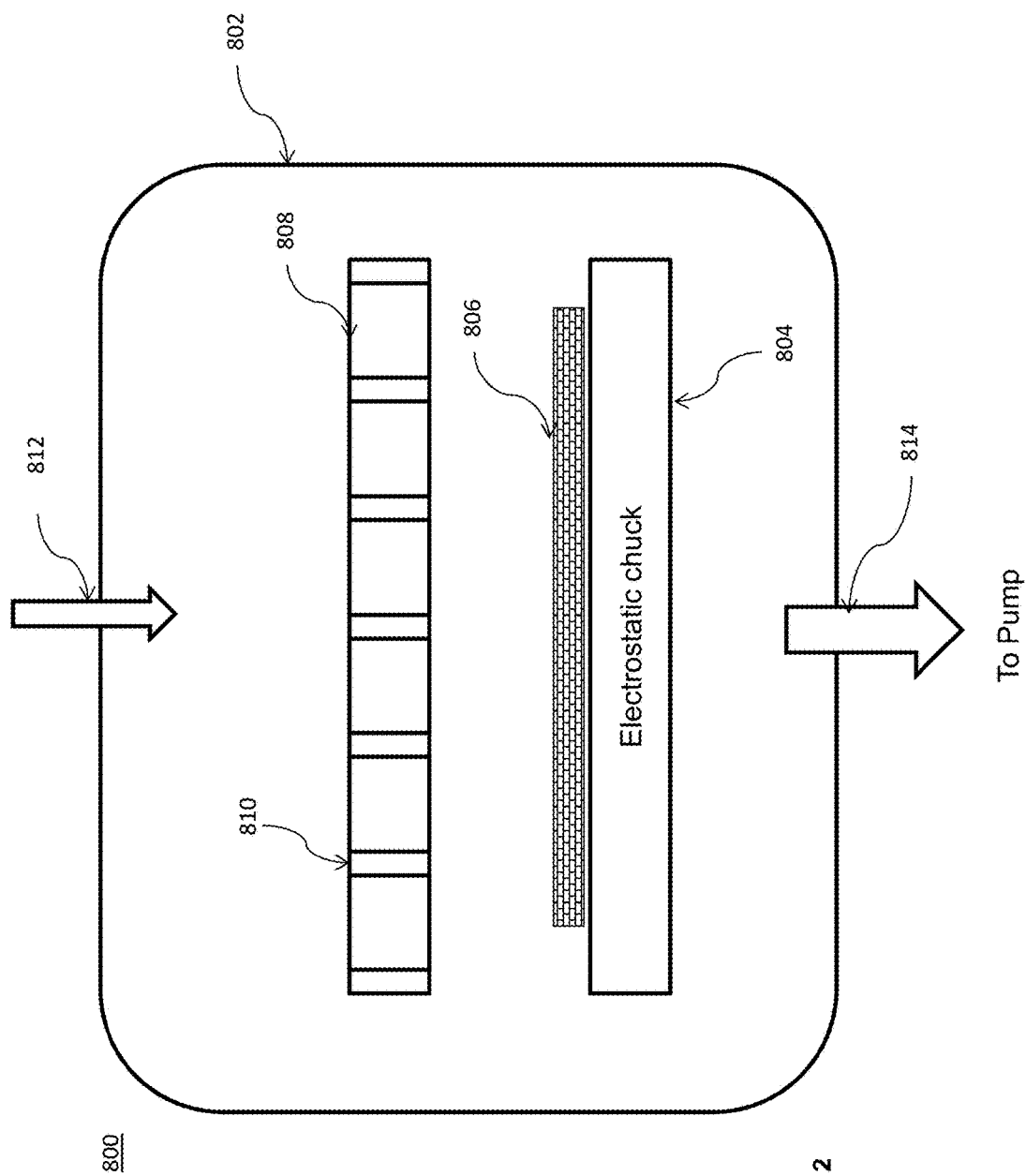
FIG. 12 is a cross-sectional side view of an exemplary reactor system applied in the exemplary deposition and etching tests.

FIG. 12 is an exemplary cross-sectional side view of exemplary reactor system applied in deposition and etching tests. As shown, the reactor 800 includes a reactor chamber 802. Inside of the reactor chamber 802, a wafer 806 attached on the top of a bottom electrode 804 may be placed in the bottom portion of the reactor chamber 802, and a silicon top electrode showerhead 808 may be placed on the top portion of the reactor chamber 802. The bottom electrode 804 may be an electrostatic chuck having bias power applied thereto. For example, 2 MHz RF bias power may be applied to the bottom electrode 804. The wafer 806 may have multiple layers that need to be etched. The silicon top electrode showerhead 808 has a plurality of holes 810 in the showerhead through which the gases pass. The gases may be introduced into the reactor chamber 802 through gas inlet 812 and then pass through holes 810 in the showerhead 808 for uniform gas distribution. Source power may be applied to the silicon top electrode showerhead 808. For example, 27 MHz RF source power may be applied to the silicon top electrode showerhead 808. Between the silicon top electrode showerhead 808 and the bottom electrode 804 is the plasma region. The gases passing through the holes 810 in the showerhead 808 may be ionized in the plasma region and then perform etching on the wafer 806. The gases may be removed by pumping the gases out of the reactor chamber 802 from outlet 814.

Figure 13:
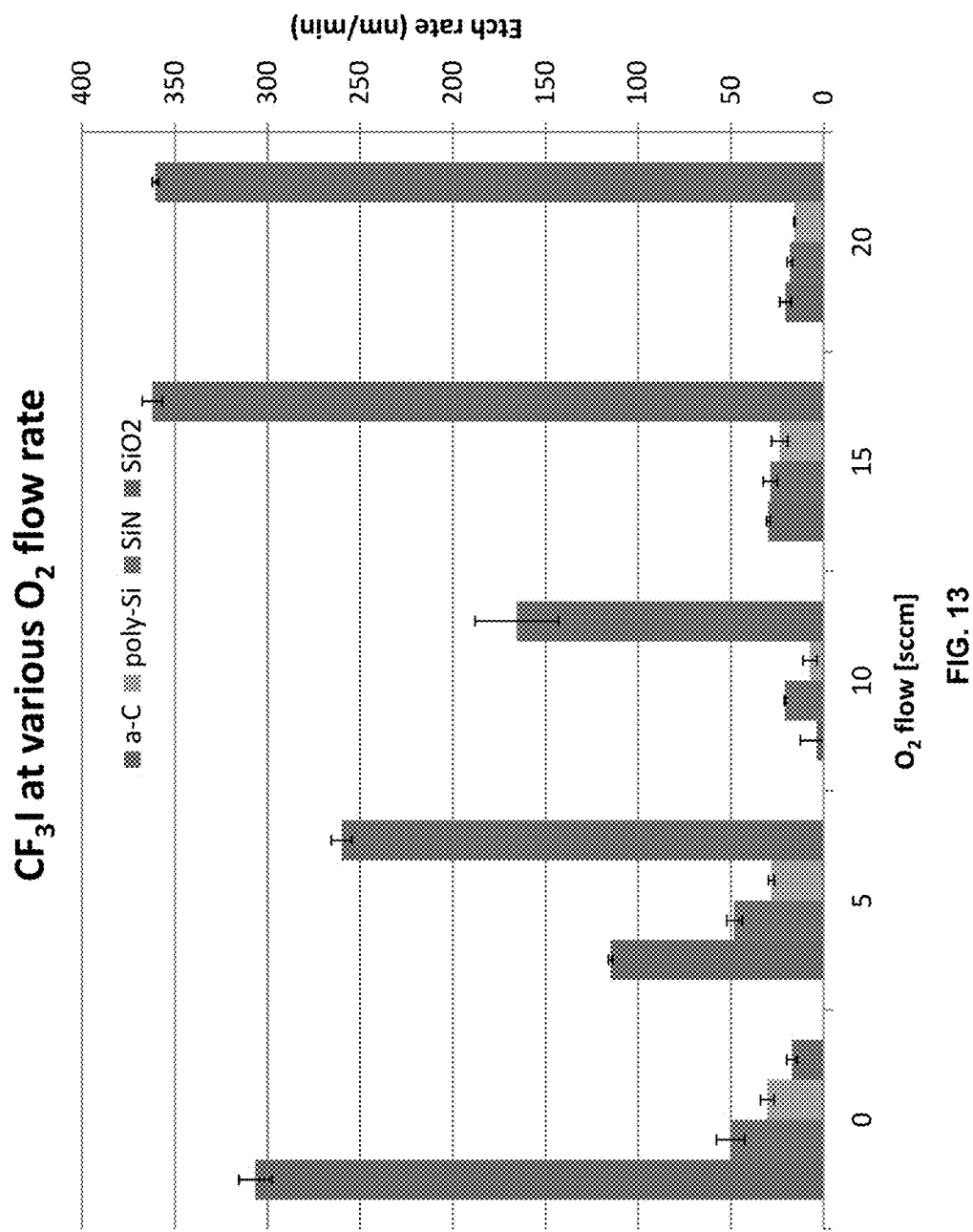
FIG. 13 is a graph demonstrating etch rates of SiO, SiN, p-Si and a-C with $CF_3I$ and $O_2$.

FIG. 13 is a graph demonstrating etch rates of SiO, SiN, p-Si and a-C with $CF_3I$ and $O_2$. In FIG. 13, the y-axis represents etch rates; the x-axis is $O_2$ flow rate in sccm; the $CF_3I$ flow rate is fixed at 15 sccm while the $O_2$ flow rate is varied from 0 to 20 sccm.

Figure 14:
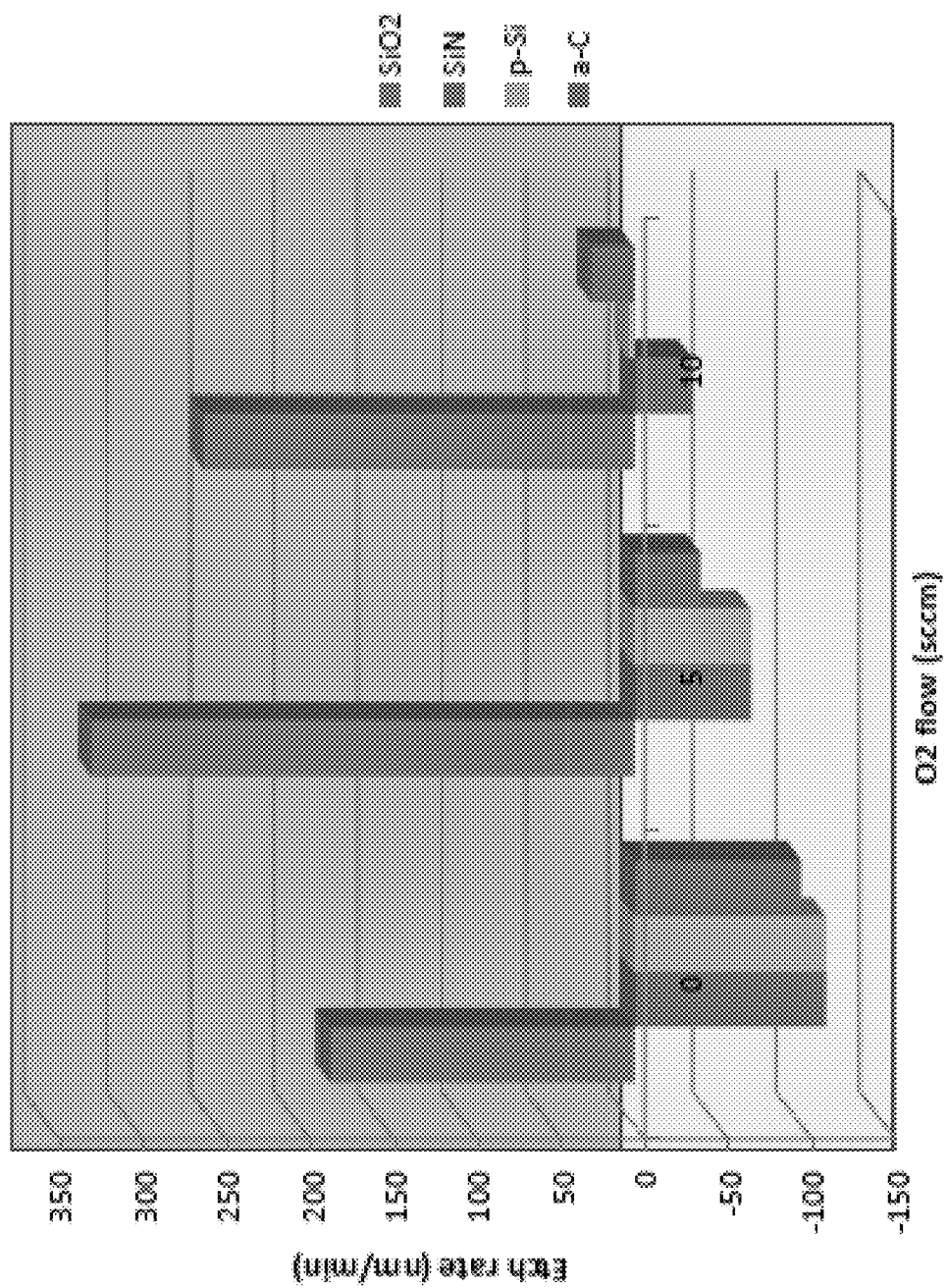
FIG. 14 is a graph demonstrating etch rates of SiO, SiN, p-Si and a-C with $C_2F_3I$ and $O_2$.

FIG. 14 is a graph demonstrating etch rates of SiO, SiN, p-Si and a-C with $C_2F_3I$ and $O_2$. In FIG. 14, the positive y-axis represents etch rates while the negative y-axis represents deposition rates; the x-axis is $O_2$ flow rate in sccm; the $C_2F_3I$ flow rate is fixed at 15 sccm while the $O_2$ flow rate is varied from 0 to 10 sccm.

Figure 15:
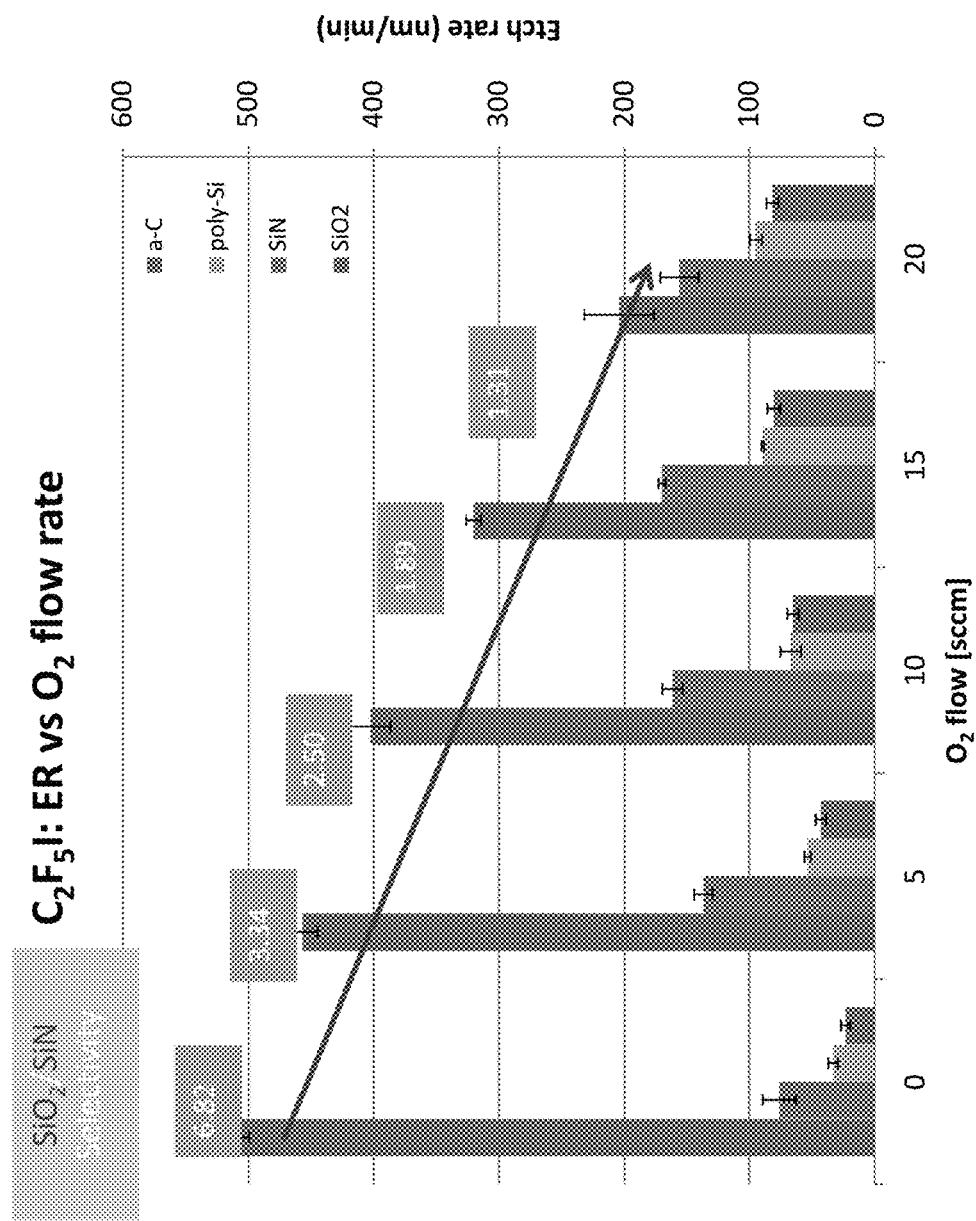
FIG. 15 is a graph demonstrating etch rates of SiO, SiN, p-Si and a-C with $C_2F_5I$ and $O_2$.

FIG. 15 is a graph demonstrating etch rates of SiO, SiN, p-Si and a-C with $C_2F_5I$ and $O_2$. In FIG. 15, the y-axis represents etch rates; the x-axis is $O_2$ flow rate in sccm; the $C_2F_5I$ flow rate is fixed at 15 sccm while the $O_2$ flow rate is varied from 0 to 20 sccm.

Figure 16:
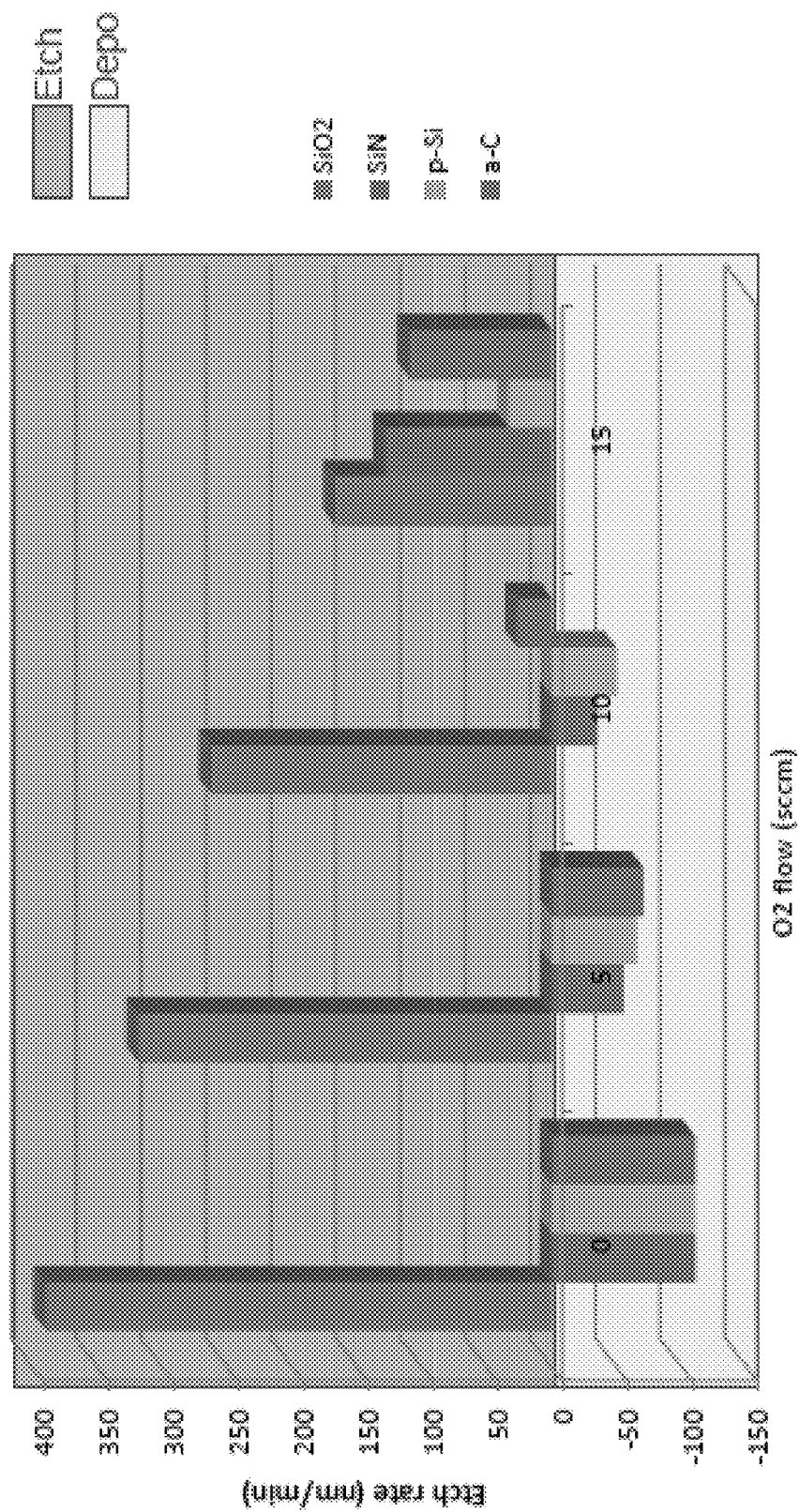
FIG. 16 is a graph demonstrating etch rates of SiO, SiN, p-Si and a-C with $C_2HF_4I$ and $O_2$.

FIG. 16 is a graph demonstrating etch rates of SiO, SiN, p-Si and a-C with $C_2HF_4I$ and $O_2$. In FIG. 16, the positive y-axis represents etch rates while the negative y-axis represents deposition rates; the x-axis is $O_2$ flow rate in sccm; the $C_2HF_4I$ flow rate is fixed at 15 sccm while the $O_2$ flow rate is varied from 0 to 15 sccm.

Figure 17:
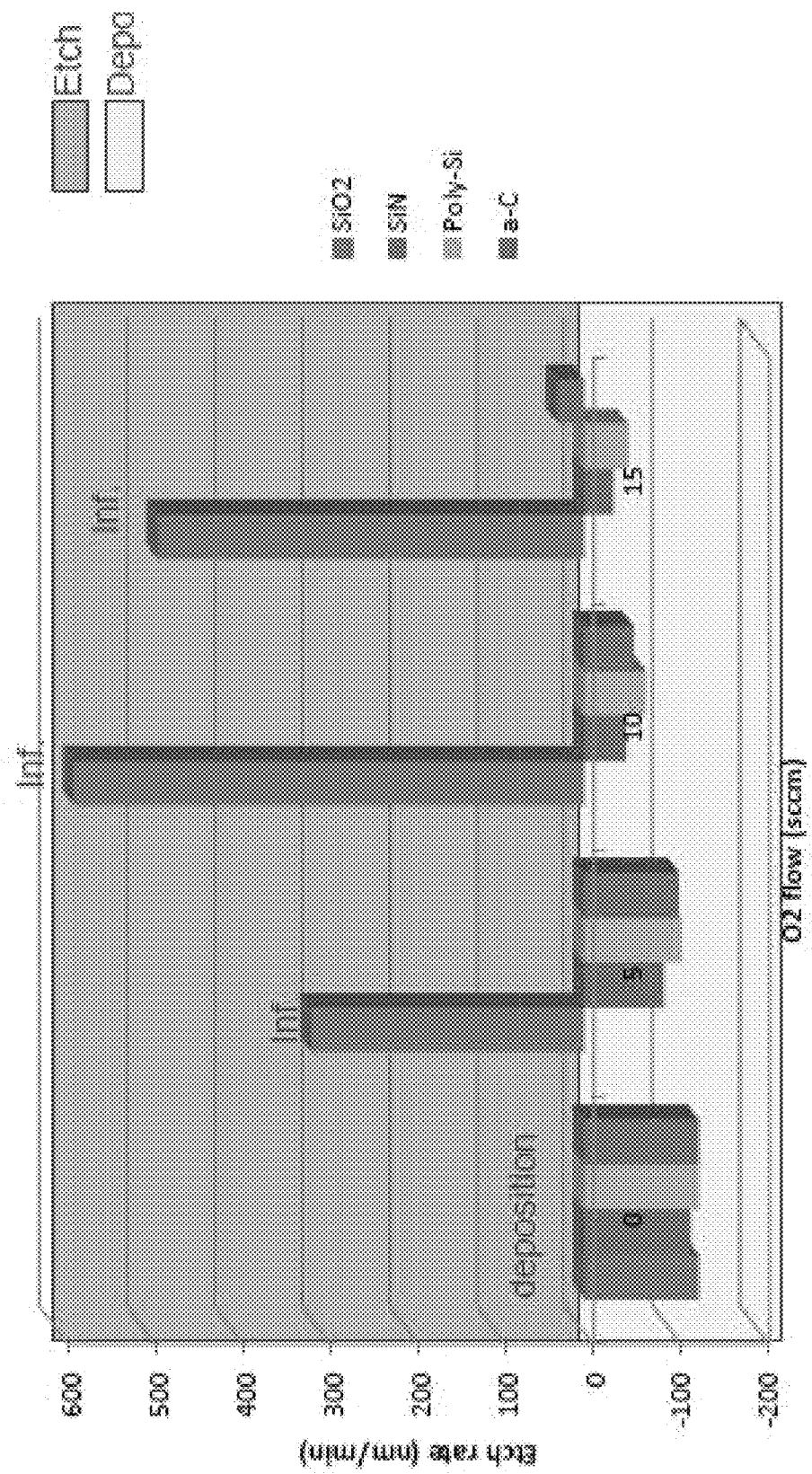
FIG. 17 is a graph demonstrating etch rates of SiO, SiN, p-Si and a-C with $C_3F_5I$ and $O_2$.

FIG. 17 is a graph demonstrating etch rates of SiO, SiN, p-Si and a-C with $C_3F_5I$ and $O_2$. In FIG. 17, the positive y-axis represents etch rates while the negative y-axis represents deposition rates; the x-axis is $O_2$ flow rate in sccm; the $C_3F_5I$ flow rate is fixed at 15 sccm while the $O_2$ flow rate is varied from 0 to 15 sccm.

Figure 18:
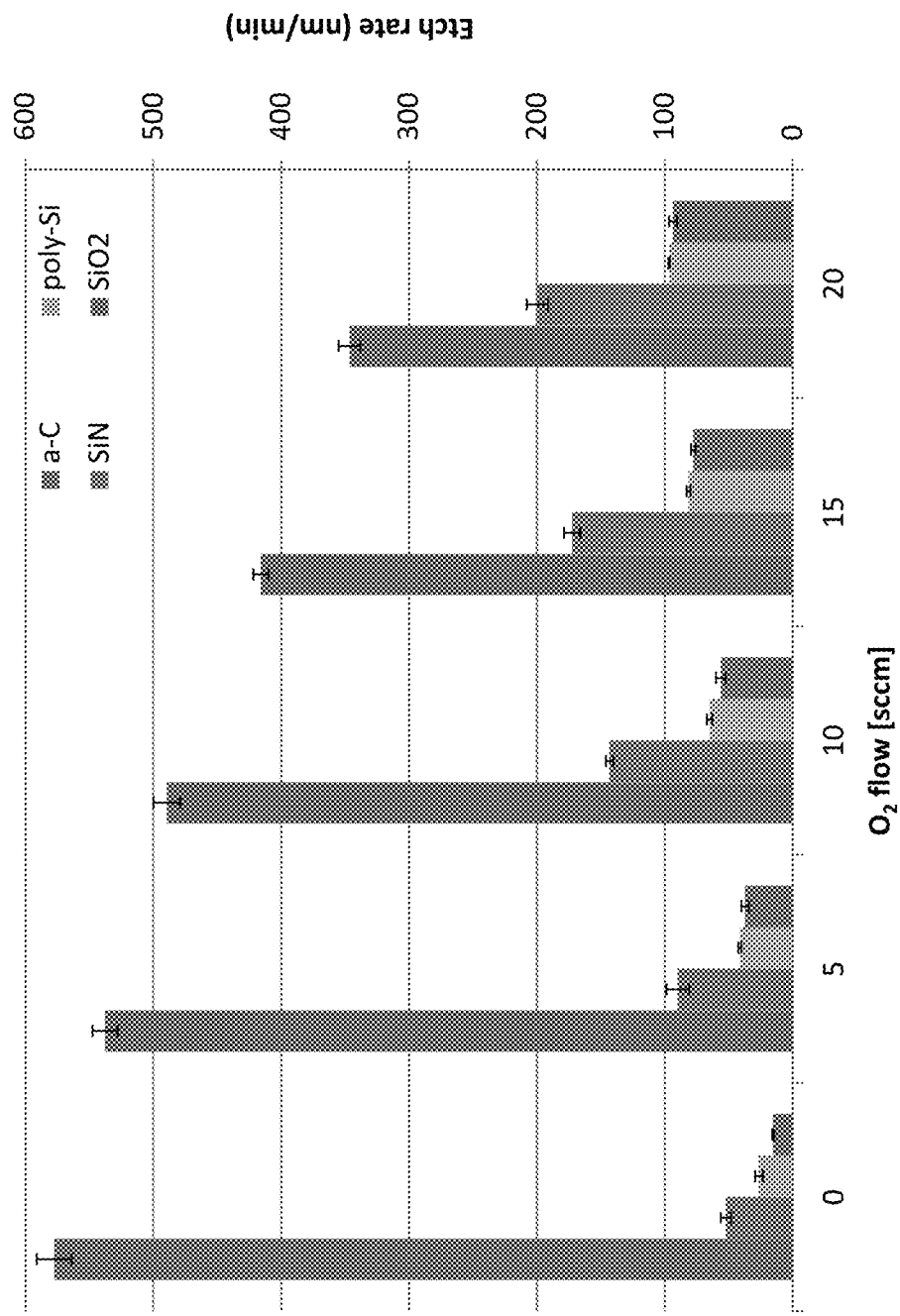
FIG. 18 is a graph demonstrating etch rates of SiO, SiN, p-Si and a-C with $C_3F_7I$ and $O_2$.

FIG. 18 is a graph demonstrating etch rates of SiO, SiN, p-Si and a-C with $C_3F_7I$ and $O_2$. In FIG. 18, the y-axis represents etch rates; the x-axis is $O_2$ flow rate in sccm; the $C_3F_7I$ flow rate is fixed at 15 sccm while the $O_2$ flow rate is varied from 0 to 20 sccm.

Addition of iodine gives increased fragmentation due to the C—I weaker bond. The lower ionization threshold of the I ion bombarding the surface yields increased selectivity for etching oxide versus amorphous carbon (a-C) or polysilicon (poly-Si). FIGS. 14, 16, and 17 are from polymerizing gases having H or unsaturation and show deposition and infinite selectivity for etching oxide to a-C, polySi, and SiN. Whereas the saturated molecules of FIGS. 13, 15, and 18 do not exhibit deposition and therefore do not have infinite selectivity, but still exhibit higher selectivity than non-Iodine containing etch gases.

Example 3

In order to enhance the etch rates of SiO, comparable to the performance of $cC_4F_8$, $CF_4$ is added to the etch gas mixture of 250 sccm Ar and 15 sccm $C_2F_3I$.

Figure 19:
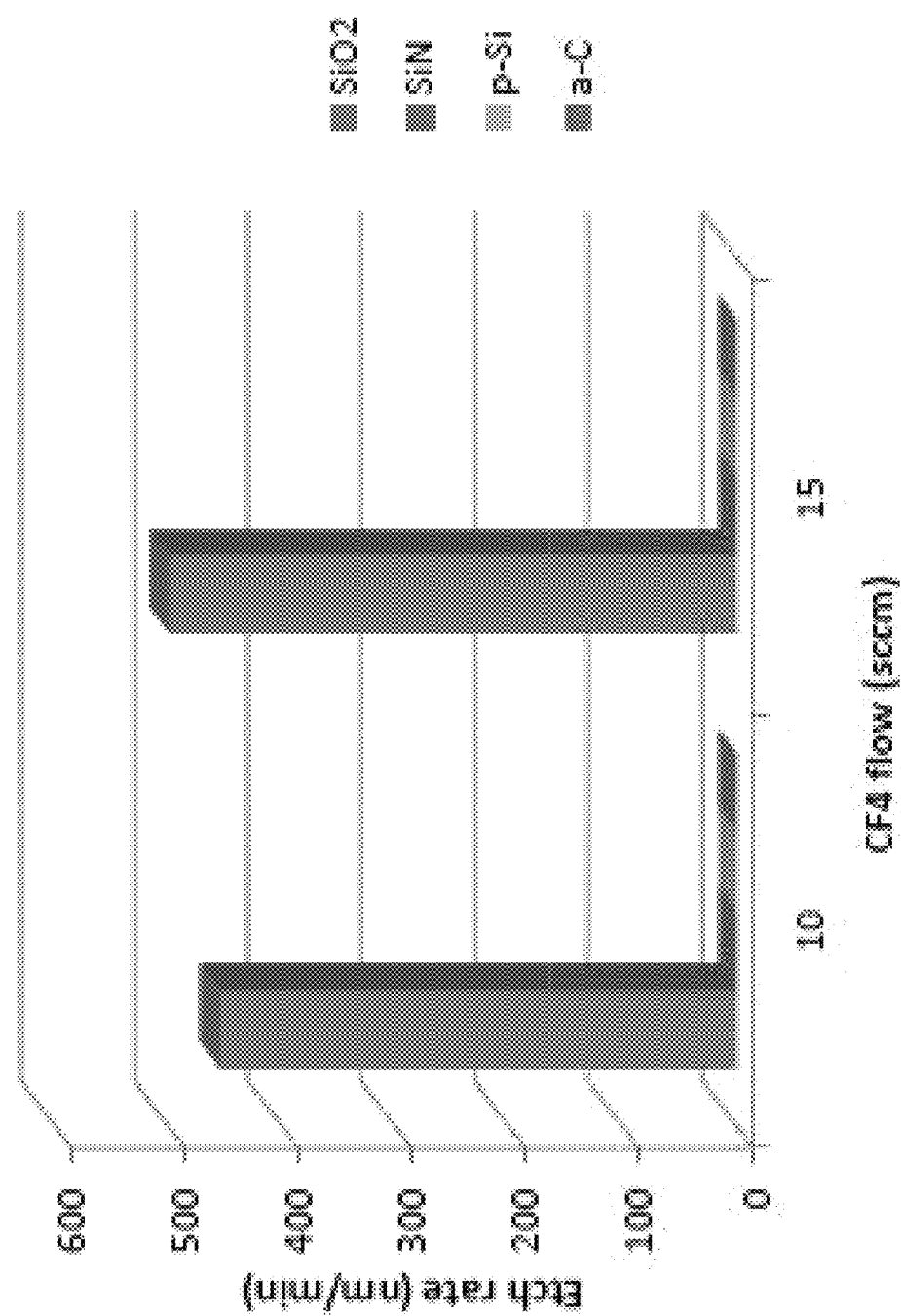
FIG. 19 is a graph demonstrating etch rates of SiO, SiN, p-Si and a-C with $C_2F_3I$ and $CF_4$.

FIG. 19 is a graph demonstrating etch rates of SiO, SiN, p-Si and a-C with $C_2F_3I$ and $CF_4$. In FIG. 19, the y-axis represents etch rates and the x-axis is $CF_4$ flow in sccm. The $C_2F_3I$ flow rate is fixed at 15 sccm and the $CF_4$ flow rate is varied from 10 to 15 sccm.

FIG. 19 demonstrates that by adding $CF_4$ to the process gas mixture, the etch rates of SiO have increased up to almost 500 nm/min while maintaining good selectivity to p-Si and a-C. Additives like $C_xF_{2x+2}$ (x=1 to 5), $C_xF_{2x}$ (x=3 to 5), $C_xF_{2x-2}$ (x=4 to 5) may be added to the mixture to enhance Oxide etch rate.

As compared to FIG. 14, substituting $CF_4$ for oxygen improves selectivity to a-C while also increasing the $SiO_2$ etch rate which is important for throughput.

In summary, the evaluation of the dry etching of SiO, SiN, p-Si and a-C films with iodine-containing etching compounds shows that the iodine-containing HFCs yield highest (up to infinite) selectivity of silicon oxide to silicon nitride and p-Si than the prior art fluorocarbons. The reason for high selectivity may be attributed to the formation of low F/C iodine containing fragments during plasma dissociation of the etch gases, which results in the formation of a protective polymer film on the substrates. Additionally, the iodine is ionized and bombards the surface with the heavy I ion similar to inert gases such as Ar, Kr, and Xe. The etching gas results presented herein show they are not only ready for contact etch process, but also may be beneficial for other etching processes on silicon or metal containing substrates, including low k etching processes.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a patterned structure, the method comprising:
    introducing a vapor of an iodine-containing etching compound into a reaction chamber containing a silicon-containing film on a substrate, wherein the iodine-containing etching compound is selected from the group consisting of $C_2H_2FI$, $C_2H_3F_2I$, $C_2H_4FI$, $C_3HF_4I$, $C_3H_2F_3I$, $C_3H_2F_5I$, $C_3H_3F_4I$, and $C_3H_4F_3I$;
    introducing an inert gas into the reaction chamber;
    activating a plasma to produce an activated iodine-containing etching compound capable of etching the silicon-containing film from the substrate to form the patterned structure; and
    removing volatile by-products from the reaction chamber, wherein the activated iodine-containing etching compound reacts with the silicon-containing film to form the volatile by-products.

2. The method of claim 1, wherein the iodine-containing etching compound is $C_2H_2FI$, $C_2H_3F_2I$ or $C_2H_4FI$.

3. The method of claim 1, wherein the iodine-containing etching compound is $C_3HF_4I$, $C_3H_2F_3I$, $C_3H_2F_5I$, $C_3H_3F_4I$, or $C_3H_4F_3I$.

4. The method of claim 1, further comprising introducing an oxidizer into the reaction chamber.

5. The method of claim 1, wherein the silicon-containing film comprises a layer of silicon oxide, silicon nitride, polysilicon, crystalline silicon, low-k SiCOH, SiOCN, SiON, $Si_aO_bH_cC_dN_e$, where a>0; b, c, d and e≥0, or combinations thereof.

6. The method of claim 5, wherein the silicon-containing film is selectively etched from an amorphous carbon layer or a photoresist layer.

7. The method of claim 5, wherein the silicon oxide layer is selectively etched from a silicon nitride, polysilicon or amorphous carbon layer.

8. The method of claim 4, wherein the method produces an aperture in the silicon-containing film having an aspect ratio between approximately 10:1 and approximately 200:1.

9. The method of claim 1, further comprising introducing an etch gas into the reaction chamber.

10. The method of claim 9, wherein the etch gas is selected from the group consisting of $cC_4F_8$, $cC_5F_8$, $C_4F_6$, $CF_4$, $CH_3F$, $CF_3H$, $CH_2F_2$, COS, F—C≡N, $CS_2$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$).

11. A method of minimizing damage to a patterned mask layer while forming a via or trench in a substrate, the method comprising:
    introducing a vapor of an iodine-containing etching compound into a reaction chamber containing a substrate having a silicon-containing film disposed thereon and a patterned mask layer disposed on the silicon-containing layer, wherein the iodine-containing etching compound is selected from the group consisting of $C_2H_2FI$, $C_2H_3F_2I$, and $C_2H_4FI$;
    introducing an inert gas into the reaction chamber; and
    etching the silicon-containing film from the substrate to form the via or trench by activating a plasma to form an activated iodine-containing etching compound.

12. The method of claim 11, wherein the activated iodine-containing etching compound produces iodine ions that strengthen the patterned mask layer.

13. The method of claim 11, wherein the iodine-containing etching compound is $C_2H_2FI$.

14. The method of claim 11, wherein the iodine-containing etching compound is $C_2H_3F_2I$.

15. The method of claim 11, wherein the iodine-containing etching compound is $C_2H_4FI$.

16. A method of reinforcing a patterned mask layer while forming a via or trench in a substrate, the method comprising:
    introducing a vapor of an iodine-containing etching compound into a reaction chamber containing a substrate having a silicon-containing film disposed thereon and a patterned mask layer disposed on the silicon-containing layer, wherein the iodine-containing etching compound is selected from the group consisting of $C_2H_2FI$, $C_2H_3F_2I$, and $C_2H_4FI$;
    introducing an inert gas into the reaction chamber; and
    implanting an I ion from the iodine-containing etching compound into the patterned mask while etching the silicon-containing film from the substrate to form the via or trench by activating a plasma to form an activated iodine-containing etching compound.

17. The method of claim 16, wherein the iodine-containing etching compound is $C_2H_2FI$.

18. The method of claim 16, wherein the iodine-containing etching compound is $C_2H_3F_2I$.

19. The method of claim 16, wherein the iodine-containing etching compound is $C_2H_4FI$.

* * * * *